United States Patent
Fujita

(10) Patent No.: US 8,097,143 B2
(45) Date of Patent: Jan. 17, 2012

(54) PLATING METHOD, LIGHT-TRANSMITTING ELECTRICALLY-CONDUCTIVE FILM AND LIGHT-TRANSMITTING ELECTROMAGNETIC WAVE SHIELD FILM

(75) Inventor: Yoshihiro Fujita, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 1098 days.

(21) Appl. No.: 11/920,352

(22) PCT Filed: Jun. 6, 2006

(86) PCT No.: PCT/JP2006/311693
§ 371 (c)(1),
(2), (4) Date: Nov. 14, 2007

(87) PCT Pub. No.: WO2006/132397
PCT Pub. Date: Dec. 14, 2006

(65) Prior Publication Data
US 2009/0065364 A1 Mar. 12, 2009

(30) Foreign Application Priority Data
Jun. 6, 2005 (JP) ................................ 2005-165724

(51) Int. Cl.
*C25D 7/00* (2006.01)
(52) U.S. Cl. ........................................ 205/138; 205/137
(58) Field of Classification Search .................. 205/138
See application file for complete search history.

(56) References Cited

U.S. PATENT DOCUMENTS

| 4,326,931 A * | 4/1982 | Kamijo et al. | 205/138 |
| 4,978,431 A | 12/1990 | Brannan et al. | |
| 5,098,544 A * | 3/1992 | Brannan et al. | 204/206 |
| 7,749,620 B2 * | 7/2010 | Yoshida et al. | 428/673 |
| 2006/0008745 A1 * | 1/2006 | Sasaki et al. | 430/322 |

FOREIGN PATENT DOCUMENTS

| JP | 59-226195 A | 12/1984 |
| JP | 3-72096 A | 3/1991 |
| JP | 07-102392 | 4/1995 |
| JP | 07-197239 | 8/1995 |
| JP | 2004-221564 | 8/2004 |
| WO | 2004/007810 A1 | 1/2004 |
| WO | WO 2004007810 A1 * | 1/2004 |

OTHER PUBLICATIONS

Machine Translation of JP 2004-221564.*

* cited by examiner

*Primary Examiner* — Harry D Wilkins, III
*Assistant Examiner* — Bryan D. Ripa
(74) *Attorney, Agent, or Firm* — Young & Thompson

(57) ABSTRACT

A plating method comprising: continuously electroplating a surface of a film having a surface resistivity of from 1 to 1,000Ω/□ in a plurality of times, wherein the plurality of times are equally divided into a former half stage and a latter half stage, and wherein an average plating time of the former half stage of the electroplating step is shorter than an average plating time of the latter half stage of the electroplating step or an average plating voltage at the latter half stage of the electroplating step is 60% or less of an average plating voltage at the former half stage of the electroplating step.

8 Claims, 3 Drawing Sheets even when electroplating is effected by a plurality of times as mentioned above, a material having a high surface resistivity can be plated only on the dipped portion on the electricity supplying side thereof ranging from the liquid level to a depth of from several centimeters to scores of centimeters. Even when the material is dipped longer, the components of the plating solution are adsorbed to the surface of the material, causing stain on the surface of the material. As a result, metal deposit cannot be uniformly formed, impairing the drop of surface resistivity after plating.

PLATING METHOD, LIGHT-TRANSMITTING ELECTRICALLY-CONDUCTIVE FILM AND LIGHT-TRANSMITTING ELECTROMAGNETIC WAVE SHIELD FILM

TECHNICAL FIELD

The present invention relates to a plating method, a light-transmitting electrically-conductive film and a light-transmitting electromagnetic wave shield film.

BACKGROUND ART

In recent years, it has been desired to develop a technique for forming an electrically-conductive thin metal film on an insulator film such as flexible print circuit board for electronic devices and electromagnetic wave shield film for plasma display.

For example, JP-A-2004-221564 discloses a method for the production of an electromagnetic wave shield film involving the exposure and development of a photosensitive material containing silver salt. In accordance with JP-A-2004-221564, a fine line pattern can be formed with a high precision as compared with other processes to obtain an excellent electromagnetic wave shield film having a high transparency and allowing mass production at reduced cost.

DISCLOSURE OF THE INVENTION

In the case where the technique disclosed in the above JP-A-2004-221564 is used to prepare an electromagnetic wave shield film, it is necessary that the developed silver formed by the exposure and development of the photosensitive material be plated with copper to lower the resistivity thereof so that high electromagnetic wave shield properties can be provided.

In the case where a material having a high surface resistivity such as the film prepared according to JP-A-2004-221564 is subjected to electroplating, problems arise that when excessive electric current flows, heat is generated, occasionally causing the scorching of the surface of the film or the generation of hydrogen gas that prevents fair plating. Therefore, in the case where such a material having a high surface resistivity is subjected to electroplating, it is necessary that plating be effected by a small portion in a plurality of plating baths while the amount of electricity to be supplied is being somewhat controlled.

However, even when electroplating is effected by a plurality of times as mentioned above, a material having a high surface resistivity can be plated only on the dipped portion on the electricity supplying side thereof ranging from the liquid level to a depth of from several centimeters to scores of centimeters. Even when the material is dipped longer, the components of the plating solution are adsorbed to the surface of the material, causing stain on the surface of the material. As a result, metal deposit cannot be uniformly formed, impairing the drop of surface resistivity after plating.

The invention has been worked out in the light of the aforementioned problems. An aim of the invention is to provide a plating method capable of uniformly plating even a film having a high surface resistivity to obtain a film having a low surface resistivity.

Another aim of the invention is to provide a uniformly plated light-transmitting electrically-conductive film and light-transmitting electromagnetic wave shield film.

The aforementioned problems can be solved by the following inventions.

(1) A plating method comprising:
continuously electroplating a surface of a film having a surface resistivity of from 1 to 1,000Ω/□ in a plurality of times,
wherein the plurality of times are equally divided into a former half stage and a latter half stage, and
wherein an average plating time of the former half stage of the electroplating step is shorter than an average plating time of the latter half stage of the electroplating step.

(2) The plating method as described in (1) above,
wherein the average plating time of the former half stage of the electroplating step is 70% or less of the average plating time of the latter half stage of the electroplating step.

(3) The plating method as described in (1) or (2) above,
wherein an average plating voltage at the latter half stage of the electroplating step is lower than an average plating voltage at the former half stage of the electroplating step.

(4) The plating method as described in any of (1) to (3) above,
wherein the average plating voltage at the latter half stage of the electroplating step is 60% or less of the average plating voltage at the former half stage of the electroplating step.

(5) A plating method comprising:
continuously electroplating a surface of a film having a surface resistivity of from 1 to 1,000Ω/□ in a plurality of times,
wherein the plurality of times are equally divided into a former half stage and a latter half stage, and
wherein an average plating voltage at the latter half stage of the electroplating step is 60% or less of an average plating voltage at the former half stage of the electroplating step.

(6) The plating method as described in any of (1) to (5) above,
wherein the electroplating step is effected in a constant voltage control mode.

(7) The plating method as described in any of (1) to (6) above,
wherein the film is a film patterned with a silver mesh.

(8) The plating method as described in (7) above,
wherein the silver mesh is formed from a developed silver.

(9) A light-transmitting electrically-conductive film produced by a method comprising a plating method as described in any of (1) to (8) above.

(10) A light-transmitting electromagnetic wave shield film comprising a light-transmitting electrically-conductive film as described in (9) above.

BEST MODE FOR CARRYING OUT THE INVENTION

Figure 1:
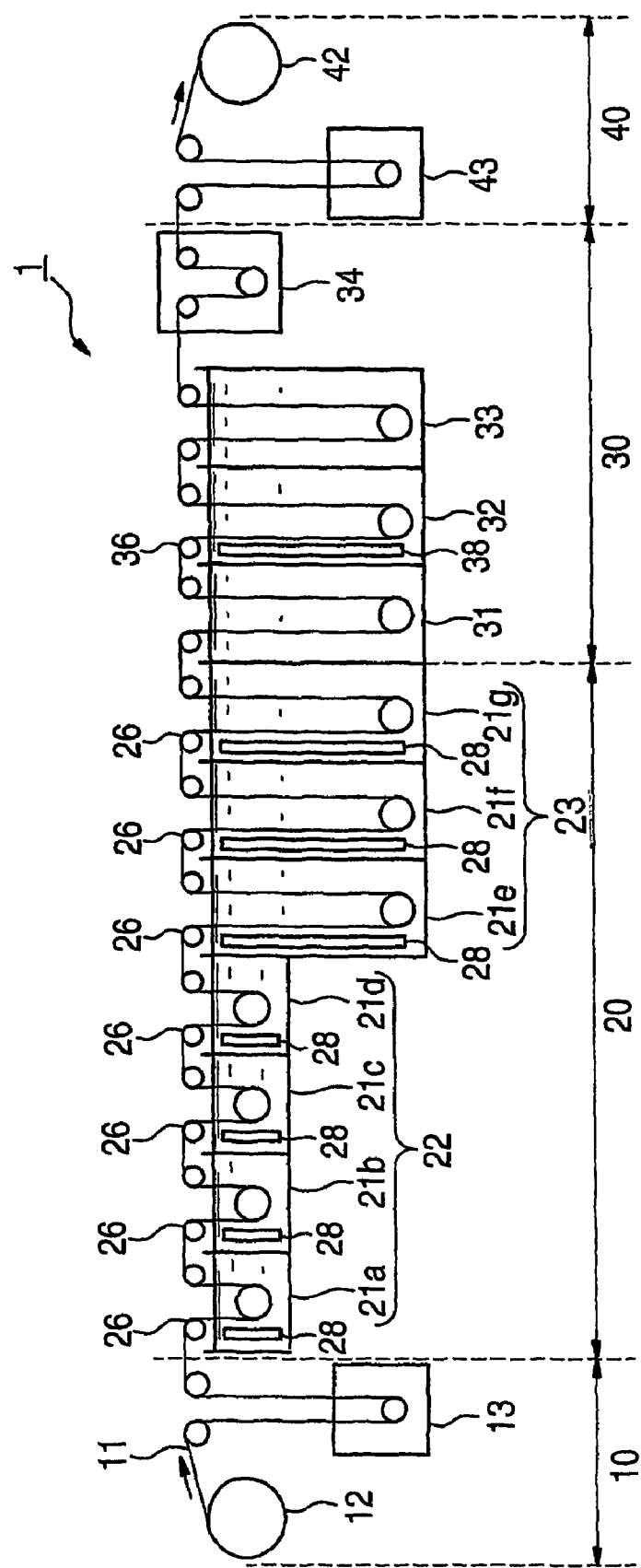
FIG. 1 is a schematic diagram illustrating an electroplating device for suitably implementing the plating method according to an aspect of the invention.

Embodiment of implementation of the plating method according to the invention will be described hereinafter in connection with the attached drawings. FIG. 1 depicts an example of the electroplating device for suitably implementing the plating method according to the invention.

An electroplating device 1 shown in FIG. 1 is adapted to unwind a film 11 of continuous length from the roll, continuously electroplate the film 11 in a plurality of plating tanks and then wind the film 11 thus electroplated in the form of roll. The arrow in FIG. 1 indicates the direction of conveyance of the film 11.

As shown in FIG. 1, in the electroplating device 1 are sequentially provided an unwinding portion 10 for unwinding the film from the roll along the film conveying path, a plating portion 20 for effecting electroplating, a post-processing portion 30 for rinsing, blackening, drying and otherwise processing the film thus plated and a winding portion 40 for winding the film in the form of roll.

The unwinding portion 10 comprises an unwinding reel 12 for unwinding the film 11 from the roll and a reservoir 13 for storing the film 11 thus unwound therein.

The plating portion 20 comprises a plurality of plating tanks 21a to 21g (7 plating tanks shown provided in FIG. 1) disposed sequentially along the direction of conveyance. As described later, in order to adjust the plating time in the various plating tanks 21a to 21g, the capacity of the plating tanks 21a to 21d are designed to be smaller than that of the plating tanks 21e to 21g.

Figure 2:
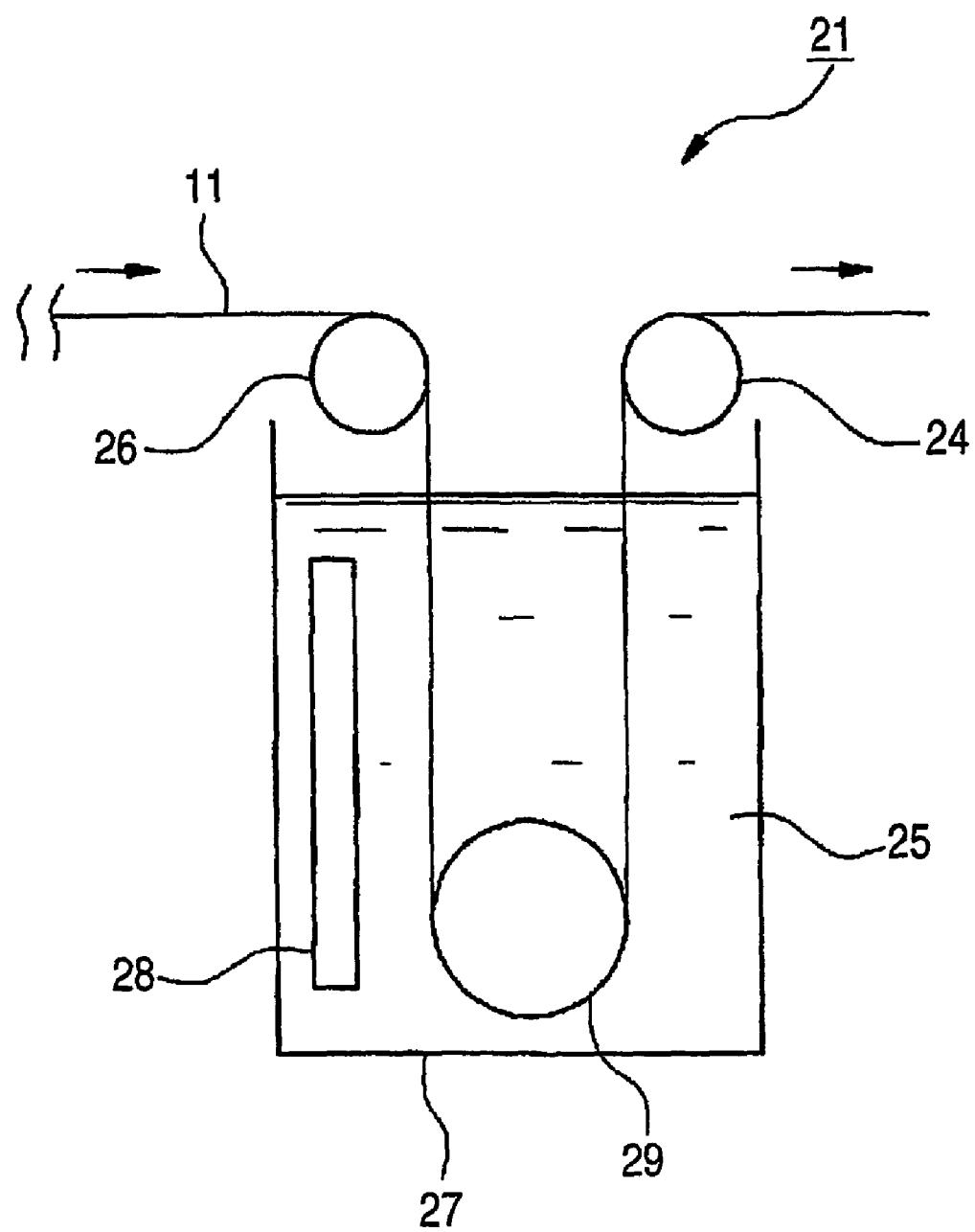
FIG. 2 is a schematic diagram illustrating a plating tank to be used in the electroplating device shown in FIG. 1.

FIG. 2 schematically depicts the plating tanks 21a to 21g. As shown in FIG. 2, the plating tanks 21 each comprise a plating bath 27 for storing a plating solution 25 over which an electricity feed roller (cathode) 26 for conveying the film 11 into the plating bath 27 while supplying electric current into the film 11 and a take-up roller 24 for conveying the film 11 thus plated out of the plating bath 27.

In the plating bath 27 is provided an anode plate 28 parallel to the film 11. In the plating bath 27 is also provided a guide roller 29 for conveying the film 11 out of the plating bath 27 in the opposite direction. The guide roller 29 is disposed movably in the vertical direction so that the plating time of the film 11 (period of time during which the film 11 is dipped in the plating solution 25) can be closely adjusted.

The electricity feed roller 26 and the anode plate 28 are connected to the positive terminal and the negative terminal of an electric power supply (not shown), respectively. An arrangement is made such that the voltage to be applied to and the current flowing through each of the plating tanks can be controlled by a predetermined circuit.

The electricity feed roller 26 may be entirely or partly supplied with electricity. However, the electricity feed roller 26 is preferably entirely supplied with electricity so that unevenness in current density and hence unevenness in plating can difficultly occur.

While the embodiment shown in FIG. 2 has a pair of cathode and anode provided on the incoming side, another pair of cathode and anode may be provided on the outgoing side.

If necessary, a washing spray nozzle, dehydrating roller or other devices for removing the plating solution from the film 11 may be provided before and after the take-up roller 24.

The post-processing portion 30 comprises a first rinse tank 31, a blackening tank 32, a second rinse tank 33 and a drying portion 34 sequentially provided therein. The blackening tank 32 comprises an electricity feed roller (cathode) 36 and an anode plate 38 provided therein as in the plating tanks 21a to 21g. The principle of electroplating can be used herein to form a blackened layer on the film.

The winding portion 40 comprises a reservoir 43 for storing the film 11 which has been subjected to the various processing steps therein and a winding reel 42 for winding the film 11 in the form of roll.

The method for plating the film 11 using the aforementioned electroplating device 1 will be described hereinafter.

Firstly, the film 11 is unwound from the unwinding reel 12, stored in the reservoir 13, and then conveyed into the plating portion 20.

The conveying speed of the film 11 is preferably predetermined to be from 1 m/min to 30 m/min, more preferably 1 m/min to 10 m/min, even more preferably from 2 m/min to 5 m/min.

In the plating portion 20, the film 11 is dipped in the plating solution 27 stored in the plating bath 25 while the electricity feed roller 26 and the anode plate 28 are being supplied with electricity by an electric power supply (not shown) with the film 11 in contact with the electricity feed roller 26 to undergo plating.

In the plating portion 20, since the capacity of the plating tanks 21a to 21d are designed to be smaller than that of the plating tanks 21e to 21g, the plating time in the plating tanks 21a to 21d is shorter than that in the plating tanks 21e to 21g. As previously mentioned, in the case where the film 11 is a film having a high surface resistivity (1 to 1,000Ω/□), plating cannot difficultly proceed in the initial stage of plating. However, by predetermining the plating time in the plating tanks 21a to 21d to be shorter than that in the plating tanks 21e to 21g, the period of time during which the film 11 is unnecessarily dipped in the plating solution can be reduced. In this manner, the period of time during which the plating solution components are attached to the film 11 can be reduced, making it possible to effect plating uniformly and efficiently.

In the invention, the aforementioned effect can be exerted at least by predetermining the average plating time in the former half stage to be shorter than the average plating time in the latter half stage.

The terms "average plating time in the former half stage" and "average plating time in the latter half stage" as used herein are defined to be the average of plating time in the former half stage and the average of plating time in the latter half stage, respectively, if the total time of supply of electricity in the plating step is equally divided by the former half stage and the latter half stage. The term "plating time" as used herein is defined to be "time during which the film is dipped in the plating solution". When the total time of supply of electricity in the plating step is odd, the processing time in the central plating tank is included in neither the former half stage nor the latter half stage.

Accordingly, in the present embodiment, the average dipping time in the plating tanks 21a to 21c among the seven plating tanks indicates the average plating time in the former half stage 22 and the average dipping time in the plating tanks 21e to 21g among the seven plating tanks indicates the average plating time in the latter half stage 23. Accordingly, it may be at least arranged such that the capacity of the plating tanks 21a to 21g is adjusted to predetermine the plating time in the former half stage 22 (plating tanks 21a to 21c) shorter than that in the latter half stage 23 (plating tanks 21e to 21g).

The plating time in the former half stage is preferably 70% or less, more preferably from 1% to 50%, even more preferably from 5% to 35% of that in the latter half stage.

The supply of electricity into the plating tanks 21a to 21g is preferably carried out in a constant voltage control mode. Referring to the reason for this consideration, electroplating is often effected in a constant current control mode because it allows control over deposit thickness. However, in the case where a high resistivity film is plated as in the invention, when plating is effected in a constant current control mode, the applied voltage shows a great partial change, causing damage on the film or the attachment of stain on the electricity feed roller. In order to avoid these problems, plating should be effected in a constant voltage control mode.

In the plating portion 20, the average plating voltage in the latter half stage 23 is preferably lower than that in the former half stage 22. The plating voltage in the latter half stage is more preferably 60% or less, even more preferably 50% or less, particularly preferably from 5% to 30% of the plating voltage in the former half stage. When the average plating voltage is thus controlled, the deterioration of the plating efficiency due to the generation of hydrogen can be suppressed, making it possible to effect plating more efficiently with little unevenness.

In the plating method of the invention, when the applied voltage is controlled such that the plating voltage in the latter half stage is 60% or less of that in the former half stage, even if the processing time in the various plating tanks are the same, as shown in the examples described later, the effect of the invention can be sufficiently exerted. However, both the processing time and the applied voltage are preferably controlled to exert higher effect.

The applied voltage is preferably from 1 V to 100 V, more preferably from 2 V to 60 V. The current at the inlet side of the first plating tank is preferably from 1 A to 30 A, more preferably from 2 A to 10 A.

The plating solution 27 is not specifically limited and may be any known electrolytic solution. In the case of copper plating, for example, an electrolytic solution containing copper sulfate pentahydrate in an amount of from 30 g/l to 300 g/l and sulfuric acid in an amount of from 30 g/l to 300 g/1 may be used. In the case of nickel plating, an electrolytic solution containing nickel sulfate, nickel hydrochloride or the like may be used. In the case of silver plating, an electrolytic solution containing silver cyanide or the like may be used. The plating solution may comprise additives such as surface active agent, sulfur compound and nitrogen compound incorporated therein.

Subsequently, the film 11 thus plated is conveyed into the post-processing portion 30 where it is then subjected to rinse and blackening. In the blackening portion 32, the film 11 is dipped in a blackening solution while the electricity feed roller 35 and the anode plate 36 being supplied with electricity to undergo blackening so that a blackened layer is provided on the deposited metal layer. As the blackening solution 37 there may be used an electrolytic solution of black copper, black nickel, black tin, black nickel-tin, black nickel-zinc or the like.

Finally, the film 11 is dried in the drying portion 34, and then wound up on the reel 42 in the winding portion 40.

As mentioned above, in accordance with the plating method according to the present embodiment, the plating time in the former half stage is predetermined to be shorter than that in the latter half stage, making it possible to prevent the attachment of unnecessary plating components to the film and hence plate the film uniformly. Thus, a film having a low surface resistivity can be obtained. In accordance with the plating method according to the invention, the plating voltage in the latter half stage is predetermined to be 60% or less of that in the former half stage, making it possible to prevent the drop of efficiency due to generation of hydrogen and hence plate the film uniformly. Thus, a film having a low surface resistivity can be obtained.

Figure 3:
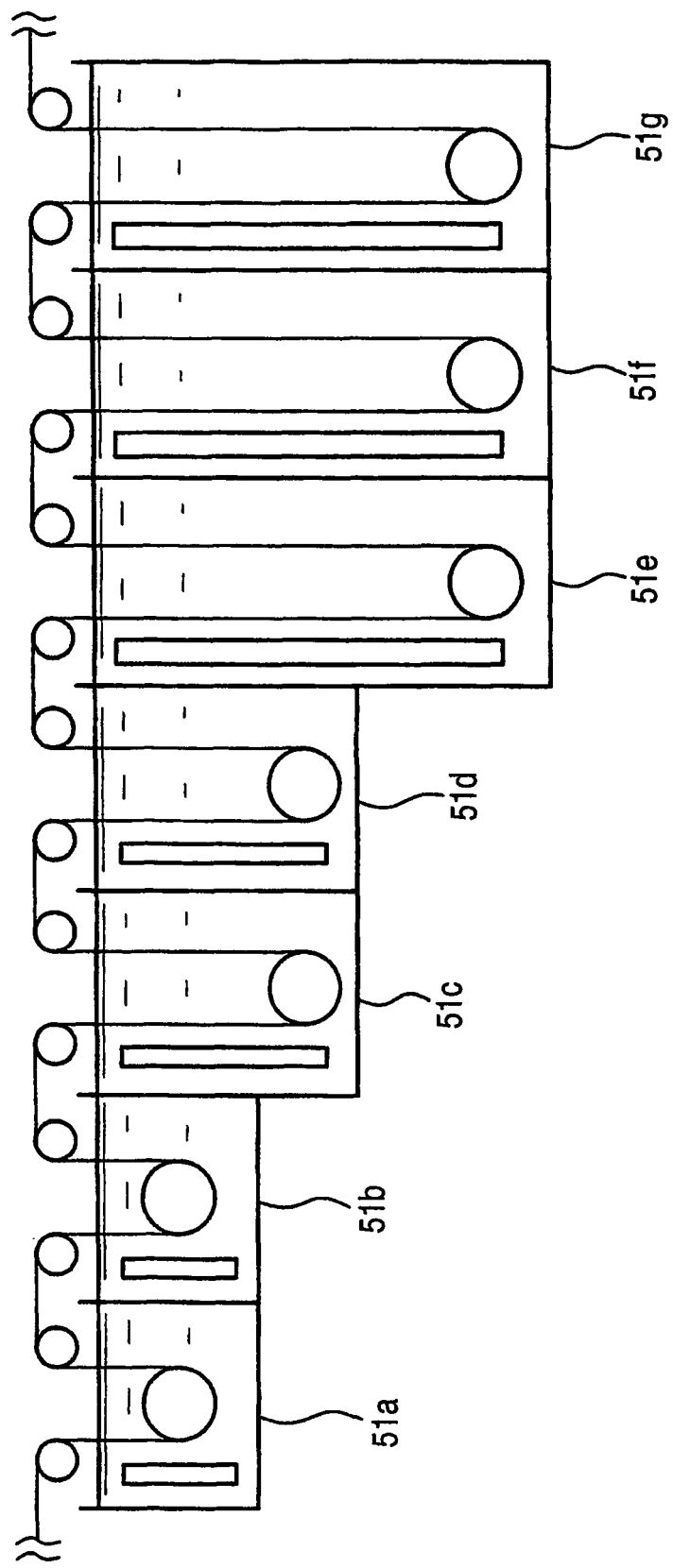
FIG. 3 is a schematic diagram illustrating an exemplary embodiment of the plating portion of the electroplating device, wherein 1 denotes an electroplating device; 11 denotes a film; 20 denotes a plating portion; 21a to 21g denote plating tanks; 22 denotes a former half stage; and 23 denotes a latter half stage.

The embodiment of the invention is not limited to the configuration of the plating portion 20 shown in FIG. 1. As in FIG. 3, for example, arrangement may be made such that the capacity of the plating tank increases gradually from plating tank 51*a* to the plating tank 51*g*. In this arrangement, as the deposit grows, the plating time can be gradually prolonged to advantage.

Referring to the number of electroplating tanks, the aforementioned embodiment has been described with reference to the case where there are provided seven plating tanks. However, the invention is not limited to this embodiment. It may suffice if there are provided two or more electroplating tanks. In the aforementioned embodiment, the post-processing step is not essential by may be omitted. Between the winding portion 10 and the plating portion 20 may be provided interposed a pre-processing portion for effecting acid washing and rising.

As the film which can be applied to the plating method of the invention there may be applied any film. Any film having a high surface resistivity (1 to 1,000Ω/□) may be subjected to plating. The surface resistivity of the film to be plated is preferably from 5 to 500Ω/□, more preferably from 10 to 100Ω/□.

The film to be used in the invention is preferably a film patterned with silver mesh. The silver mesh pattern on the film is preferably continuous (not electrically discontinuous). If may suffices if the silver mesh is continuous at least partly. When the electrically-conductive pattern is discontinuous, the film cannot be plated on some areas or can be plated unevenly in the first tank. By subjecting the continuous silver mesh pattern to the aforementioned plating, an electrically-conductive metal coat layer is formed on the silver mesh. The film thus plated (electrically-conductive film) can be used as printed circuit board formed on insulator film, electromagnetic wave shield film for PDP or the like.

As the silver mesh there may be used one formed by any of developed silver method, ink jet method and screen printing method, preferably developed silver method. As the film having a silver mesh pattern formed by developed silver there is preferably used one formed by subjecting a photosensitive material having an emulsion layer containing a silver salt emulsion on a support to exposure and development. The configuration of the photosensitive material and the method for producing the film having a silver mesh pattern formed by developed silver from this photosensitive material will be described hereinafter.

1. Photosensitive Material

[Emulsion Layer]

The aforementioned photosensitive material preferably has on the support an emulsion layer containing a silver salt emulsion as a photosensor. The formation of an emulsion layer on the support can be accomplished by the use of any known coating technique. The emulsion layer may comprise a dye, a binder, a solvent or the like incorporated therein besides the silver salt emulsion as necessary. The various components constituting the emulsion layer will be described hereinafter.

(Dye)

The emulsion layer may comprise a dye incorporated therein. The dye is incorporated as a filter dye or for the purpose of preventing irradiation or other various purposes. As such a dye there may be used a solid disperse dye. Preferred examples of the dye include those represented by the general formulae (FA), (FA1), (FA2) and (FA3) disclosed in JP-A-9-179243. Specific preferred examples of these dyes include Compounds F1 to F34 disclosed in the above cited patent. Further examples of the dye employable herein include those represented by the general formulae (II-2) to (II-24) disclosed in JP-A-7-152112, those represented by the general formulae (III-5) to (III-18) disclosed in JP-A-7-152112 and those represented by the general formulae (IV-2) to (IV-7) disclosed in JP-A-7-152112.

Referring further to the dye employable herein, as solid finely dispersed dyes to be decolored during development or fixing there may be used cyanine dyes, pyrilium dyes and aminium dyes disclosed in JP-A-3-138640. Examples of the dyes which are not decolored during processing include cyanine dyes having a carboxyl group disclosed in JP-A-9-96891, cyanine dyes not having an acidic group disclosed in JP-A-8-245902, lake type cyanine dyes disclosed in JP-A-8-333519, cyanine dyes disclosed in JP-A-1-266536, holopolar type cyanine dyes disclosed in JP-A-3-136038, pyrilium dyes disclosed in JP-A-62-299959, polymer type cyanine dyes disclosed in JP-A-7-253639, solid fine dispersion of oxonol dye disclosed in JP-A-2-282244, light-scattering particles as disclosed in JP-A-63-131135, Yb3+ compounds disclosed in JP-A-9-5913, and ITO powders disclosed in JP-A-7-113072. Further, dyes represented by the general formulae (F1) and (F2) disclosed in JP-A-9-179243 may be used. In some detail, Compounds F35 to F112 disclosed in the above cited JP-A-9-179243 may be used.

As the aforementioned dye there may be used a water-soluble dye. Examples of such a water-soluble dye include oxonol dyes, benzylidene dyes, melocyanine dyes, cyanine dyes, and azo dyes. Useful among these water-soluble dyes are oxonol dyes, hemioxonol dyes, and benzylidene dyes. Specific examples of the water-soluble dye employable herein include those disclosed in British Patents 584,609 and 1,177,429, JP-A-48-85130, JP-A-49-99620, JP-A-49-114420, JP-A-52-20822, JP-A-59-154439, JP-A-59-208548, and U.S. Pat. Nos. 2,274,782, 2,533,472, 2,956,879, 3,148,187, 3,177,078, 3,247,127, 3,540,887, 3,575,704, 3,653,905 and 3,718,427.

The content of the dye in the aforementioned emulsion layer is preferably from 0.01 to 10% by mass, more preferably from 0.1 to 5% by mass from the standpoint of anti-irradiation effect and drop of sensitivity due to the rise of the content of the dye. (In this specification, mass ratio is equal to weight ratio.)

(Silver Salt Emulsion)

Examples of the silver salt emulsion employable herein include inorganic silver chlorides such as silver halide and organic silver salts such as silver acetate. A silver halide emulsion having excellent photosensor properties is preferably used. The technique to be used in the silver salt photographic film or photographic paper concerning silver halide, film for printing plate, emulsion mask for photomask, etc. can be used also in the photosensitive material according to the present embodiment.

As the halogen element to be contained in the aforementioned silver halide there may be used any of chlorine, bromine, iodine and fluorine or a combination thereof. For example, silver halide mainly composed of AgCl, AgBr or AgI is preferably used. More preferably, silver halide mainly composed of AgBr or AgCl is used. Silver bromochloride, silver bromochloroiodide or silver bromochloride is also preferably used. More preferably, silver bromochloride, silver bromide, silver bromochloroiodide or silver bromoiodide is used. Most preferably, silver bromochloride or silver bromochloroiodide containing silver chloride in an amount of 50 mol-% or more is used.

The term "silver halide mainly composed of AgBr (silver bromide)" as used herein is meant to indicate silver halide having a bromide ion molar fraction of 50% or more. The particulate silver halide mainly composed of AgBr may contain iodide ion or chloride ion besides bromide ion.

The silver halide to be used herein is a particulate solid material. From the standpoint of image quality of silver mesh pattern formed after exposure and development, the average grain diameter of the silver halide grains is preferably from 0.1 nm to 100 nm (1 μm), more preferably from 0.1 nm to 100 nm, even more preferably from 1 nm to 50 nm as calculated in terms of sphere.

The term "diameter of silver halide grain as calculated in terms of sphere" is meant to indicate the diameter of the grain having the same volume as that of the silver halide grain.

The shape of the silver halide grain is not specifically limited and may be any of various shapes such as sphere, cube, tablet (e.g., hexagonal tablet, triangular tablet, rectangular tablet), octahedron and tetradecahedron, preferably cube or tetradecahedron.

The silver halide grain may be made of a phase which differs from interior to surface layer. The silver halide grain may have a localized layer having a different halogen formulation from other portions in the interior or surface thereof.

The silver halide emulsion which is an emulsion layer coating solution can be prepared by a method disclosed in P. Glafkides, "Chimie etPhysique Photographique", Paul Montel, 1967, G. F. Dufin, "Photographic Emulsion Chemistry", The Focal Press, 1966, V. L. Zelikman et al, "Making and Coating Photographic Emulsion", The Forcal Press, 1964, etc.

In some detail, any of acid method, neutral method, etc. may be used. The reaction of the soluble silver salt with the soluble halogen salt can be accomplished by single jet method or double jet method, singly or in combination.

As the method for forming silver halide grains there may be used a method involving the formation of grains in the atmosphere of excess silver ions (so-called reverse jet method). As one of double jet methods there may be used a method which comprises keeping the pAg value of the liquid phase in silver halide is produced constant, i.e., so-called controlled double jet method.

Alternatively, a so-called silver halide solvent such as ammonia, thioether and tetra-substituted thiourea may be used to form silver halide grains. More desirable among these silver halide solvents are tetra-substituted thiourea compounds. For details of these tetra-substituted thiourea compounds, reference can be made to JP-A-53-82408 and JP-A-55-77737.

Preferred examples of thiourea compounds employable herein include tetramethylthio urea, and 1,3-dimethyl-2-imidazolidinethione. The amount of the silver halide solution to be added depends on the kind of the compound used and the desired grain size and halogen formulation but is preferably from $10^{-5}$ to $10^{-2}$ mol per mol of silver halide.

The use of the aforementioned controlled double jet method and the grain forming method using a silver halide solvent makes it possible to obtain a silver halide emulsion having a regular crystal form and a sharp grain size distribution to advantage.

In order to uniformalize the grain size, a method which comprises changing the rate of addition of silver nitrate or alkali halide depending on the rate of grain growth as disclosed in British Patent 1,535,016, JP-A-48-36890 and JP-A-52-16364 or a method which comprises changing the concentration of an aqueous solution as disclosed in British Patent 4,242,445 and JP-A-55-158124 is used to allow silver to grow rapidly to such an extent that the critical saturation cannot be exceeded.

The silver halide emulsion to be used in the formation of the emulsion layer is preferably a monodisperse emulsion having a fluctuation coefficient of 20% or less, more preferably 15% or less, most preferably 10% or less as represented by {(standard deviation of grain size)/(average grain size)}× 100.

The silver halide emulsion may have a plurality of silver halide emulsions having different grain sizes in admixture.

The silver halide emulsion may contain metals belonging to the groups VIII and VIIB. In order to attain high contrast and low fogging in particular, the silver halide emulsion preferably contains a rhodium compound, an iridium compound, a ruthenium compound, an iron compound, an osmium compound or the like. These compounds may be compounds having various ligands. Examples of these ligands include cyanide ions, halogen ions, thiocyanate ions, nitrosyl ions, water, hydroxide ions, pseudo halogens, ammonia, and organic molecules such as amine (e.g., methylamine, ethylene diamine), heterocyclic compound (e.g., imidazole, thiazole, 5-methylthiazole, mercaptothiazole), urea and thiourea.

In order to enhance sensitivity, a dope of hexacyano metal complex such as $K_4[Fe(CN)_6]$, $K_4[Ru(CN)_6]$ and $K_3[Cr(CN)_6]$ can be used to advantage.

As the rhodium compound there may be used a water-soluble rhodium compound. Examples of the water-soluble rhodium compound employable herein include halogenated rhodium (III) compounds, hexachlorodium (III) complex salts, pentachloroaquoridium complex salts, tetrachlorodiaquoridium complex salts, hexabromorhodium (III) complex salts, hexaaminerhodium (III) complex salts, trizalatorhodium (III) complex salts, and $K_3Rh_2Br_9$.

These rhodium compounds are used in the form of solution in water or a proper solvent. In order to stabilize the rhodium compound solution, a commonly used method, i.e., method involving the addition of an aqueous solution of halogenated hydrogen (e.g., hydrochloric acid, bromic acid, hydrofluoric acid) or halogenated alkali (e.g., KCl, NaCl, KBr, NaBr) may be employed. Instead of using a water-soluble rhodium, another particulate silver halide doped with rhodium may be added and dissolved during the preparation of silver halide.

Examples of the aforementioned iridium compound include hexachloroiridium complex salts such as $K_2IrCl_6$ and $K_3IrCl_6$, hexabromoiridium complex salts, hexaammineiridium complex salts, and pentachloronitrosyliridium complex salts.

Examples of the aforementioned ruthenium compounds include hexachlororuthenium, pentachloronitrosyl ruthenium, and $K_4[Ru(CN)_6]$.

Examples of the aforementioned iron compound include potassium hexacyanoferrate (II), and ferrous thiocyanate.

The aforementioned ruthenium and osmium are added in the form of a water-soluble complex salt disclosed in JP-A-63-2042, JP-A-1-285941, JP-A-2-20852 and JP-A-2-20855. Particularly preferred among these water-soluble complex salts is a six-coordinate complex represented by the following general formula.

$$[ML_6]^{-n}$$

wherein M represents Ru or Os; and n represents 0, 1, 2, 3 or 4.

In this case, the counter ion is not significant. For example, ammonium or alkaline metal ion may be used. Preferred examples of ligands include halide ligands, cyanide ligands, cyanate ligands, nitrosyl ligands, and thionitrosyl ligands. Specific examples of the complexes to be used in the invention will be given below, but the invention is not limited thereto.

$[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{-3}$, $[OsCl_5(NO)]^{-2}$, $[Os(NO)(CN)_5]^{-2}$, $[Os(NS)Br_5]^{-2}$, $[Os(CN)_6]^{-4}$, $[OS(O)_2(CN)_5]^{-4}$.

The added amount of these compounds is preferably from $10^{-10}$ to $10^{-2}$ mol/mol-Ag, more preferably from $10^{-9}$ to $10^{-3}$ mol/mol-Ag per mol of silver halide.

Besides these compounds, silver halides containing Pd (II) ion and/or Pd metal may be used to advantage. Pd may be uniformly distributed in the silver halide grain but is preferably incorporated in the silver halide grain in the vicinity of the surface layer thereof. The expression that Pd is "incorporated in the silver halide grain in the vicinity of the surface layer thereof" as used herein means that the region ranging from the surface of the silver halide grain to the depth of 50 nm has a layer having a higher palladium content than in other layers.

Such a silver halide grain can be prepared by adding Pd in the course of formation of silver halide grain. Pd is preferably added after the addition of silver ion and halogen ion in an amount of 50% or more of the total added amount. It is also preferred that Pd (II) ions be added during ripening so that they can be present in the surface layer of silver halide grain.

The content of Pd ion and/or Pd metal in silver halide is preferably from $10^{-4}$ to 0.5 mol/mol-Ag, more preferably from 0.01 to 0.3 mol/mol-Ag per mol of silver in the silver halide.

Examples of the Pd compound to be used include $PdCl_4$ and $Na_2PdCl_4$.

In order to enhance the sensitivity as photosensor, the photosensitive material may be subjected to chemical sensitization which is normally effected for photographic emulsion. Examples of the chemical sensitization method employable herein include chalcogen sensitization such as sulfur sensitization, selenium sensitization and tellurium sensitization, noble metal sensitization such as gold sensitization, and reduction sensitization. These sensitization methods may be used singly or in combination. Preferred examples of the combination of the aforementioned chemical sensitization methods, if used, include combination of sulfur sensitization and gold sensitization, combination of sulfur sensitization and selenium sensitization, and combination of sulfur sensitization, tellurium sensitization and gold sensitization.

The aforementioned sulfur sensitization is normally carried out by stirring the emulsion at a temperature as high as 40° C. or more with a sulfur sensitizer added thereto for a predetermined period of time. As the sulfur sensitizer there may be used any known compound. For example, besides sulfur compounds contained in gelatin, various sulfur compounds such as thiosulfate, thio urea, thiazole and rhodanine can be used. Preferred examples of sulfur compounds employable herein include thiosulates and thiourea compounds. The added amount of the sulfur sensitizer depends on various conditions such as pH, temperature and size of silver halide grain during chemical ripening and is preferably from $10^{-7}$ to $10^{-2}$ mols, more preferably from $10^{-5}$ to $10^{-3}$ mols per mol of silver halide.

As the selenium sensitizer to be used in the aforementioned selenium sensitization there may be used any known selenium compound. In other words, the aforementioned selenium sensitization is normally carried out by stirring the emulsion at a temperature as high as 40° C. or more with an unstable selenium compound and/or non-unstable selenium compound added thereto for a predetermined period of time. As the aforementioned unstable selenium compound there may be used a compound disclosed in JP-B-44-15748, JP-A-43-13489, JP-A-4-109240 and JP-A-4-324855. In particular, compounds represented by the general formulae (VIII) and (IX) disclosed in JP-A-4-324855 are preferably used.

The tellurium sensitizer to be used in the aforementioned tellurium sensitization is a compound which produces silver telluride that presumably becomes a sensitizing nucleus in the surface or interior of the silver halide grain. The rate at which silver telluride is formed in the silver halide emulsion can be examined by the method disclosed in JP-A-5-313284. In some detail, compounds disclosed in U.S. Pat. Nos. 1,623, 499, 3,320,069 and 3,772,031, British Patents 235,211, 1,121,496, 1,295,462 and 1,396,696, Canadian Patent 800, 958, JP-A-4-204640, JP-A-4-271341, JP-A-4-333043, JP-A-5-303157, Journal of Chemical Society Chemical Communication, 635, 1980, ibid 1102, 1979, ibid 645, 1979, Journal of Chemical Society Perkin Transaction, 1, 2191, 1980, S. Patai, The Chemistry of Organic Selenium and Tellurium Compounds, Vol. 1, 1986, and ibid, Vol. 2, 1987, can be used. In particular, compounds represented by the general formulae (II), (III) and (IV) disclosed in JP-A-5-313284 are preferably used.

The amount of the selenium sensitizer and tellurium sensitizer to be used depends on the kind of the silver halide grain used, the chemical ripening conditions, etc. but is normally from $10^{-8}$ to $10^{-2}$ mols, preferably from $10^{-7}$ to $10^{-3}$ mols per mol of silver halide. The chemical sensitization conditions in the invention are not specifically limited, but the pH value is from 5 to 8, the pAg value is from 6 to 11, preferably from 7 to 10 and the temperature is from 40° C. to 95° C., preferably from 45° C. to 85° C.

Examples of the aforementioned noble metal sensitizer include gold, platinum, palladium, and iridium. In particular, gold sensitization is preferably effected. Specific examples of gold sensitizer to be used in gold sensitization include chloroauric acid, potassium chloroaurate, potassium aurithiocyanate, gold sulfide, gold thioglucose (I), and gold thiomannose (I). These gold sensitizers may be used in an amount of from about $10^{-7}$ to $10^{-2}$ mols per mol of silver halide. The silver halide emulsion to be used in the invention may be used in the presence of cadmium salt, sulfite, lead salt, thallium salt or the like during the formation of silver halide grains or physical ripening.

Further, the silver salt emulsion may be subjected to reduction sensitization. As a reduction sensitizer there may be used stannous salt, amine, formamidine sulfinate, silane compound or the like. For the aforementioned silver halide emulsion, a thiosulfonic acid compound may be added according to the method disclosed in European Disclosed Patent (EP) 293917. Referring to the silver halide emulsion to be used in the preparation of the photosensitive material of the invention, silver halide emulsions may be used singly or in combination of two or more thereof (those having different average grain sizes, halogen formulations, crystal habits, chemical sensitization conditions or sensitivities). In particular, in order to obtain a high contrast, an emulsion having a higher sensitivity should be provided toward the support to advantage as disclosed in JP-A-6-324426.

(Binder)

The emulsion layer may comprise a binder incorporated therein for the purpose of uniformly dispersing silver halide grains therein and helping the adhesion between the emulsion layer and the support. As the binder there may be used any of water-insoluble polymers and water-soluble polymers. However, a water-soluble polymer is preferably used.

Examples of the aforementioned binder include polysaccharides such as gelatin, polyvinyl alcohol (PVA), polyvinyl pyrrolidone (PVP) and starch, cellulose and derivatives thereof, polyethylene oxides, polysaccharides, polyvinylamines, chitosans, polylisins, polyacrylic acids, polyalginic acids, polyhyaluronic acids, and carboxycelluloses. These binders are neutral, anionic or cationic depending on the ionic properties of their functional group.

The content of the binder in the emulsion layer is not specifically limited and can be properly predetermined within a range such that desired dispersibility and adhesion can be exhibited.

(Solvent)

The solvent to be used in the formation of emulsion layer is not specifically limited but may be water, organic solvent (e.g., alcohol such as methanol, ketone such as acetone, amide such as formamide, sulfoxide such as dimethyl sulfoxide, ester such as ethyl acetate, ether), ionic liquid or mixture thereof.

The content of the solvent in the emulsion layer is preferably from 30% to 90% by mass, more preferably from 50% to 80% by mass based on the total mass of silver salts, binders and other components incorporated in the emulsion layer.

[Support]

As the support to be used in the photosensitive material there may be used a plastic film, plastic sheet or glass sheet.

Examples of the aforementioned plastic film and plastic sheet include polyesters such as polyethylene terephalatate (PET) and polyethylene naphthalate, polyolefins such as polyethylene (PE), polypropylene (PP), polystyrene and EVA, vinyl-based resins such as polyvinyl chloride and polyvinylidene chloride, polyether ether ketones (PEEK), polysulfones (PSF), polyether sulfones (PES), polycarbonates (PC), polyamides, polyimides, acrylic resins, and triacetyl celluloses (TAC).

In the invention, the aforementioned plastic film is preferably a polyethylene terephthalate film from the standpoint of transparency, heat resistance, handleability and cost.

In the case where the electrically-conductive film thus plated is used as an electromagnetic wave shield film for display, the support preferably has a high transparency because the electromagnetic wave shield film is required to have transparency. In this case, the total visible light transparency of the plastic film or plastic sheet is preferably from 70% to 100%, more preferably from 85% to 100%, particularly preferably from 90% to 100%. The aforementioned plastic film and plastic sheet may be colored to such an extent that the purpose of electrically-conductive film cannot be impaired.

The plastic film and plastic sheet may be each used in the form of single layer or multi-layer film formed by two or more layers in combination.

The thickness of the plastic film and plastic sheet is preferably 200 µm or less, more preferably from 20 µm to 180 µm, most preferably from 50 µm to 120 µm.

The glass sheet, if used as a support, is not specifically limited in its kind. However, in the case where the electrically-conductive film is used as an electromagnetic wave shield film for display, a reinforced glass sheet having a reinforced layer provided on the surface thereof is preferably used. It is very likely that the reinforced glass sheet can prevent damage as compared with unreinforced glass sheet. A reinforced glass sheet obtained by an air cooling method is desirable from the standpoint of safety because even if destroyed, the resulting fragments are small enough and their edges are not sharp.

[Protective Layer]

The photosensitive material of the invention may have a protective layer made of a binder such as gelatin and high molecular polymer provided on the emulsion layer. The provision of such a protective layer makes it possible to improve scratch resistance or dynamic properties. However, it is preferred from the standpoint of plating efficiency that the protective layer be not provided. The thickness of the protective layer, if any, is preferably as small as possible (e.g., 0.2 µm or less). The coating method for forming the aforementioned protective layer is not specifically limited. Any known coating method may be properly selected.

2. Production of Film Having Silver Mesh Pattern

The aforementioned photosensitive material can be subjected to exposure, development and optionally other processing steps to produce a film having a silver mesh pattern. The various steps will be further described hereinafter.

[Exposure]

The exposure can be effected using electromagnetic wave. Examples of electromagnetic wave include visible light, ultraviolet ray, and radiation such as X ray. For the exposure, a light source having a wavelength distribution may be used. Alternatively, a light source having a specific wavelength may be used.

As the aforementioned light source there may be used, e.g., cathode ray tube (CRT) for scanning exposure. The cathode ray tube exposure device is simple, compact and cheap as compared with devices using laser. The cathode ray tube exposure device can also be easily adjusted in light axis and color. As the cathode ray tube to be used in imagewise exposure there may be used any light-emitting material that emits light in spectral range as necessary. For example, any one of or a mixture of two or more of red-emitting material, green-emitting material and blue-emitting material may be used. The spectral range is not limited to the aforementioned red, green and blue colors. A material that emits yellow, orange or violet light or a fluorescent material that emits light in infrared range may be used. In particular, a cathode ray tube that uses these light-emitting materials in admixture to emit white light is often used. An ultraviolet lamp is also desirable. A mercury vapor lamp that emits g-ray, i-ray or the like may be also used.

The exposure can be carried out using various laser beams. As the laser for scanning exposure there may be used a gas laser, a light-emitting diode, a semiconductor laser or second harmonics generating light source (SHG) a combination of a semiconductor laser or a solid laser comprising a semiconductor laser as an exciting light source and a nonlinear optical crystal that emits high density monochromatic light. Further, KrF excimer laser, ArF excimer laser, F2 laser or the like may be used. In order to render the system compact and less expensive, the exposure is preferably carried out using a semiconductor laser or a second harmonics generating light source (SHG) comprising a semiconductor or solid laser and a nonlinear optical crystal in combination. In particular, in order to design a compact, inexpensive, long-lived and highly stable device, the exposure is preferably effected using a semiconductor laser.

As the laser beam there is preferably used a blue semiconductor laser beam in the wavelength of 430 to 460 nm (presented by Nichia Corporation at the 48th Joint Lecture on Physics in March 2001), a green laser beam having a wavelength of about 530 nm retrieved by subjecting a semiconductor laser beam (oscillation wavelength: about 1,060 nm) to wavelength conversion using a $LiNbO_3$ SHG crystal have a wave guide-shaped domain-inverted structure, an infrared semiconductor laser beam having a wavelength of about 685 nm (Type No. HL6738MG, produced by Hitachi Limited) or a red semiconductor laser beam having a wavelength of about 650 nm (Type No. HL6501MG, produced by Hitachi Limited).

The exposure is preferably patternwise made in lattice form. The patternwise exposure may be carried out by mask exposure utilizing a photomask or by scanning exposure using laser beam. In this case, refractive exposure using lens or reflective exposure using a reflector may be effected. Any exposure process such as contact exposure, proximity exposure, reduction projection exposure and reflective projection exposure may be used.

[Development]

The development can be accomplished by any ordinary development technique for use in silver salt photographic film, photographic paper, film for printing plate, emulsion mask for photomask, etc. The developer to be used herein is not specifically limited but may be a PQ developer, MQ developer, MAA developer or the like. Examples of commercially available developers employable herein include CN-16, CR-56, CP45X, FD-3 and Papitol (produced by Fuji Photo Film Co., Ltd.), C-41, E-6, RA-4, D-19 and D-72 (produced by Eastman Kodak Company), and developers in their kits. Alternatively, lith developer may be used.

As the lith developer there may be used D85 produced by Eastman Kodak Company.

As the developer there may be used also a dihydroxybenzene-based developer. Examples of the dihydroxybenzene-based developer include hydroquinone, chlorohydroquinone, isopropyl hydroquinone, methyl hydroquinone, and hydroquinone monosulfonate. Particularly preferred among these dihydroxybenzene-based developers is hydroquinone. Examples of auxiliary developers which exhibit superadditivity with the aforementioned dihydroxybenzene-based developer include 1-phenyl-3-pyrazolidones, and p-aminophenols. As the developer to be used in the production method of the invention there is preferably used a combination of dihydroxybenzene-based developer and 1-phenyl-3-pyrazolidone or a combination of dihydroxybenzene-based developer and p-aminophenol.

Specific examples of 1-phenyl-3-pyrazolidone to be used as an auxiliary developer or developer to be combined with its derivative include 1-phenyl-3-pyrazolidone, 1-phenyl-4,4-dimethyl-3-pyrazolidone, and 1-phenyl-4-methyl-4-hydroxymethyl-3-pyrazolidone.

Examples of the aforementioned p-aminophenol-based auxiliary developer include N-methyl-p-aminophenol, p-aminophenol, N-(β-hydroxyethyl)-p-aminophenol, and N-(4-hydroxyphenyl)glycine. Preferred among these p-aminophenol-based auxiliary developers is N-methyl-p-aminophenol. The dihydroxybenzene-based developer is preferably used in an amount of from 0.05 to 0.8 mols/l, more preferably 0.23 mols/l or more, even more preferably from 0.23 to 0.6 mols/l. In the case where a dihydroxybenzene and a 1-phenyl-3-pyrazolidone or p-aminophenol are used in combination, the former is preferably used in an amount of from 0.23 to 0.6 mols/l, more preferably from 0.23 to 0.5 mols/l and the latter is preferably used in an amount of 0.06 mols/l or less, more preferably from 0.03 to 0.003 mols/l.

The developer (hereinafter, both the development initiator and the developer replenisher will be referred simply to as "developer") may contain commonly used additives (e.g., preservative, chelating agent). Examples of the preservative employable herein include sulfites such as sodium sulfite, potassium sulfite, lithium sulfite, ammonium sulfite, sodium bisulfite, potassium sulfite and formaldehyde sodium bisulfite. The bisulfite is preferably used in an amount of 0.20 mols/l or more, more preferably 0.3 mols/l or more. When the bisulfite is added in too large an amount, it causes silver stain in the developer. Therefore, the upper limit of the amount of sulfite is preferably 1.2 mols/l, particularly preferably from 0.35 to 0.7 mols/l.

As the preservative for dihydroxybenzene-based developer there may be used a small amount of an ascorbic acid derivative in combination with the sulfite. Examples of the ascorbic acid derivative employable herein include ascorbic acid, erythorbic acid, which is a stereoisomer thereof, and salts thereof with alkali (e.g., sodium, potassium). As the ascorbic acid derivative there is preferably used sodium erythorbate from the standpoint of material cost. The added amount of the ascorbic acid derivative is preferably from 0.03 to 0.12 mols, more preferably from 0.05 to 0.10 mols, particularly preferably from 0.05 to 0.10 mols per mol of dihydroxybenzene-based developer. In the case where as the preservative there is used an ascorbic acid derivative, the developer is preferably free of boron compound.

Examples of other additives which can be incorporated in the developer include development inhibitors such as sodium bromide and potassium bromide, organic solvents such as ethylene glycol, diethylene glycol, triethylene glycol and dimethyl formamide, development accelerators such as alkanolaminde (e.g., diethanolamine, triethanolamine), imidazole and derivatives thereof, and fog inhibitors or black peppers such as mercapto-based compound, indazole-based compound, benzotriazole-based compound and benzoimidazole-based compound. Specific examples of the aforementioned benzoimidazole-based compound include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenztriazole, sodium 4-[(2-mercapto-1,3,4-thiadiazole-2-il)thio]butanesulfonate, 5-amino-1,3,4-thiadiazole-2-thiol, methyl benzotriazole, 5-methylbenzotriazole, and 2-mercapto benzotriazole. The content of these benzotriazole-based compounds is normally from 0.01 to 10 mmol, preferably from 0.1 to 2 mmol per liter of developer.

The aforementioned developer may further comprise various organic and inorganic chelating agents incorporated therein. As the aforementioned inorganic chelating agent there may be used sodium tetrapolyphosphate, sodium hexamethaphosphate or the like. On the other hand, as the aforementioned chelating agent there may be mainly used an organic carboxylic acid, aminopolycarboxylic acid, organic phosphonic acid, aminophosphonic acid or organic phosphonocarboxylic acid.

The added amount of these chelating agents is preferably from $1\times10^{-4}$ to $1\times10^{-1}$ mols, more preferably from $1\times10^{-3}$ to $1\times10^{-2}$ mols per liter of developer.

The developer of the invention may further comprise any of compounds disclosed in JP-A-56-24347, JP-B-56-46585, JP-B-2849 and JP-A-4-362942 incorporated therein as a silver stain inhibitor.

The developer of the invention may further comprise a compound disclosed in JP-A-61-267759 incorporated therein as a dissolving aid. The developer may further contain a color-toning agent, a surfactant, a defoaming agent, a membrane hardening agent and the like according to need.

The development temperature and time are correlated to each other and are normally determined according to the relation with the total processing time. In general, the development temperature is preferably from about 20° C. to about 50° C., more preferably from about 25° C. to about 45° C. The development time is preferably from 5 seconds to 2 minutes, more preferably from 7 seconds to 1 minute and 30 seconds.

The development step may involve fixing step to be effected for the purpose of removing silver salts from the unexposed area to stabilize the photosensitive material. The fixing can be accomplished by any fixing technique for use in silver salt photographic film, photographic paper, film for printing plate, emulsion mask for photomask, etc.

Preferred examples of components of the fixing solution to be used in the aforementioned fixing step will be described below.

The fixing solution comprises sodium thiosulfate, ammonium thiosulfate, and optionally tartaric acid, citric acid, gluconic acid, boric acid, iminodiacetic acid, 5-sulfosalicylic acid, glucoheptoic acid, tiron, ethylenediaminetetraacetic acid, diethylenetriaminepentaacetic acid, nitrilotracetic acid, and salts thereof incorporated therein. The fixing solution is preferably free of boric acid from the standpoint of recent environmental protection. Examples of the fixing agent to be incorporated in the fixing solution include sodium thiosulfate, and ammonium thiosulfate. Ammonium thiosulfate is preferably used from the standpoint of fixing rate. However, sodium thiosulfate may be used from the standpoint of recent environmental protection. The amount of these known fixing agents to be used can be properly varied and is normally from about 0.1 to about 2 mols/l, particularly preferably from 0.2 to 1.5 mols/l. If necessary, the fixing solution may comprise a hardener (e.g., water-soluble aluminum compound), a preservative (e.g., sulfite, bisulfite), pH buffer (e.g., acetic acid), pH adjustor (e.g., ammonia, sulfuric acid), a chelating agent, a surface active agent, a wetting agent and a fixing accelerator incorporated therein.

Examples of the aforementioned surface active agent include anionic surface active agents such as sulfate and sulfonate, polyethylene-based surface active agents and amphoteric surface active agents disclosed in JP-A-57-6740. The fixing solution may comprise any known antifoaming agent incorporated therein.

Examples of the aforementioned wetting agent include alkanolamine and alkylene glycol. Examples of the aforementioned fixing accelerator include thiourea derivatives disclosed in JP-B-45-35754, JP-A-58-122535 and JP-A-58-122536, alcohols having a triple bond in molecule, thioether compounds disclosed in U.S. Pat. No. 4,126,459, and mesoion compounds disclosed in JP-A-4-229860. Also, compounds disclosed in JP-A-2-44355 may be used. Examples of the pH buffer employable herein include organic acids such as acetic acid, malic acid, succinic acid, tartaric acid, citric acid, oxalic acid, maleic acid, glycolic acid and adipic acid, and inorganic buffers such as boric acid, phosphate and sulfite. Preferred among these pH buffers are acetic acid, tartaric acid, and sulfite. The pH buffer is used for the purpose of preventing the rise of pH value of the fixing agent caused by carrying-in of developer. The pH buffer is preferably used in an amount of from about 0.01 to 1.0 mols/l, more preferably from about 0.02 to 0.6 mols/l. The pH value of the fixing solution is preferably from 4.0 to 6.5, particularly preferably from 4.5 to 6.0. As the aforementioned dye elution accelerator there may be used a compound disclosed in JP-A-64-4739.

Examples of the hardener to be incorporated in the fixing solution include water-soluble aluminum salts and chromium salts. As the hardener there is preferably used a water-soluble aluminum salt. Examples of the water-soluble aluminum salts employable herein include aluminum chloride, aluminum sulfate, and potassium alum. The added amount of the aforementioned hardener is preferably from 0.01 to 0.2 mols/l, more preferably from 0.03 to 0.08 mols/l.

The temperature at the aforementioned fixing step is preferably from about 20° C. to 50° C., more preferably from about 25° C. to 45° C. The fixing time is preferably from 5 seconds to 1 minute, more preferably from 7 seconds to 50 seconds. The replenishment rate of the fixing solution is preferably 600 ml/m$^2$ or less, more preferably 500 ml/m$^2$, particularly preferably 300 ml/m$^2$ or less based on the amount of the photosensitive material to be processed.

The photosensitive material which has thus been developed and fixed is then preferably subjected to rinse or stabilization. The rinse or stabilization step is normally effected at a rinse water flow rate of 20 l or more per m$^2$ of photosensitive material. The rinse or stabilization step may be effected at a replenishment rate of 3 l or less (including 0, i.e., reserved water rinse). In this manner, it not only allows water saving processing but also eliminates the necessity of piping in the automatic developing machine. As a method for reducing the replenishment rate of rinse water there has been heretofore known a multi-stage countercurrent process (e.g., two-stage, three-stage). When this multi-stage countercurrent process is applied to the production method of the invention, the photosensitive material which has been fixed can be processed in sequential contact with the processing solutions gradually toward normal formulation, i.e., less stained with fixing solution, making it possible to effect rinse more efficiently. In the case where rinse is effected with a small amount of water, a rinse tank comprising a squeeze roller or crossover roller disclosed in JP-A-63-18350 and JP-A-62-287252 is more preferably provided. In order to eliminate the burden of pollution which can raise problem during rinse with a small amount of water, the addition of various additives or filtration may be additionally effected. In accordance with the aforementioned method, the overflow from the rinse bath or stabilization bath caused by the replenishment with mildproofing rinse bath or stabilization bath water depending on the processing step can be partly or entirely utilized as a processing solution having a fixing capacity at the previous processing step as disclosed in JP-A-60-235133. In order to prevent unevenness in water bubble and/or transfer of processing components from the squeeze roller to the film thus processed during rinse with a small amount of water, a water-soluble surface active agent or anti-foaming agent may be added.

In the rinse or stabilization step, a dye absorber disclosed in JP-A-63-163456 may be provided in the rinse tank to prevent stain with dyes eluted from the photosensitive material. In the stabilization step following the rinse step, a bath containing a compound disclosed in JP-A-2-201357, JP-A-2-132435, JP-A-1-102553 and JP-A-46-44446 may be used as a final processing bath for the photosensitive material. During this procedure, an ammonium compound, a compound of metal such as Bi and Al, a fluorescent brightener, various chelating agents, a film pH adjustor, a hardener, a germicide, a mildproofing agent, an alkanolamine or a surface active agent may be added. As the water to be used at the rinse step or stabilization step there is preferably used deionized water or water sterilized by ultraviolet sterilizing lamp or various oxidizers (e.g., ozone, hydrogen peroxide, chlorate) besides tap water. Alternatively, rinse water containing compounds disclosed in JP-A-4-39652 and JP-A-5-241309 may be used.

The bath temperature and time at the rinse step or stabilization step are from 0° C. to 50° C. and from 5 seconds to 2 minutes, respectively.

The mass of metallic silver in the exposed area after development is preferably 50% by mass or more, more preferably 80% by mass or more of the mass of silver contained in the same area before exposure. When the mass of silver contained in the exposed area is 50% by mass or more of the mass of silver contained in the same area before exposure, a high electrical conductivity can be obtained.

The gradation after development is not specifically limited but is preferably more than 4.0. When the gradation after development exceeds 4.0, the electrical conductivity can be raised while keeping the transparency of the light-transmitting portion high. As a means of predetermining the gradation to be 4.0 or more there may be used a method involving the doping of the aforementioned rhodium ion or iridium ion.

After development, the metallic silver portion may be subjected to physical development. The term "physical development" as used herein is meant to indicate the deposit of metal grains obtained by reducing metal ions such as silver ion on metal nucleus or metal compound nucleus. This physical development is utilized in the production of instant B&W films, instant slide films, printing plates, etc. The technique used in these methods can be applied to the present embodiment.

The physical development may be effected at the same time with or separately of the aforementioned development.

[Oxidation]

After development, the developed silver portion may be then subjected to oxidation. When the developed silver portion is subjected to oxidation, if metal is slightly deposited on the light-transmitting portion other than the developed silver portion, the metal can be removed, making it possible to keep the light transmission of the light-transmitting portion almost 100%.

As the oxidation method there may be used any known method using various oxidizing agents such as Fe(III) ion. As mentioned above, oxidation may be effected either or both after the exposure and development of the emulsion layer and after the physical development or plating.

After exposure and development, the developed silver area may be processed with a solution containing Pd. Pd may occur in the form of divalent palladium ion or metallic palladium. This processing makes it possible to accelerate electroless plating or physical development rate.

3. Light-Transmitting Electromagnetic Shield Film/Optical Filter

As mentioned above, when a film having a silver mesh pattern obtained by subjecting a photosensitive material containing a silver salt emulsion to exposure/development is subjected to the aforementioned plating step of the invention, a light-transmitting electrically-conductive film having an electrically-conductive metal film deposited on the silver mesh can be obtained.

This light-transmitting electrically-conductive film has high electromagnetic wave shielding properties and light-transmitting properties and thus can be incorporated as an electromagnetic wave shield film in CRT, EL, liquid crystal display, plasma display panel, other image display grid panel or picture-taking semiconductor integrated circuit such as CCD. The purpose of the electrically-conductive metal film according to the invention is not limited to the aforementioned display devices. The electrically-conductive metal film can be provided in the window or housing for viewing the interior of measuring instruments and machines or producing devices which generate electromagnetic wave or the window of buildings or automobiles subject to trouble with elecromagnetic wave from radiowave tower or high-tension wire.

The light-transmitting electrically-conductive film according to the invention has a silver mesh formed by developed silver and hence a very precise fine line pattern. In this arrangement, the image quality of the light-transmitting electrically-conductive film can be maintained or raised without remarkably impairing brightness. Thus, the light-transmitting electrically-conductive film is useful as a light-transmitting electromagnetic wave shield film to be used on the front surface of image display devices such a plasma display panel.

In order to prevent the deterioration of the electromagnetic wave shielding capacity of the light-transmitting electromagnetic wave shield film, the electrically-conductive metal portion is preferably grounded. To this end, it is preferred that the light-transmitting electromagnetic wave shield film have a conducting portion for grounding formed thereon in electrical contact with the earth of the main body of the display. The conducting portion is preferably provided around the metallic silver portion or the electrically-conductive metal portion along the edge of the light-transmitting electromagnetic wave shield film. The conducting portion may be formed by a mesh pattern or a solid metal foil which is not patterned. In order to make a good electrical contact with the earth of the main body of the display, the conducting portion is preferably not patterned as in the solid metal foil.

In the case where the light-transmitting electrically-conductive film according to the invention is used as a light-transmitting electromagnetic wave shield film, the light-transmitting electrically-conductive film (light-transmitting electromagnetic wave shield film) preferably has an adhesive layer, a glass sheet, and a protective film or functional film described later bonded thereto to form an optical filter. The various layers which can be provided on the light-transmitting electrically-conductive film (light-transmitting electromagnetic wave shield film) will be described hereinafter.

<Adhesive Layer>

The adhesive layer may be disposed on the light-transmitting electromagnetic wave shield film on the same side as the electrically-conductive metal portion or on the opposite side. The adhesive layer may be disposed at the position at which the light-transmitting electromagnetic wave shield film and the other layers (e.g., glass sheet, protective film, functional film) are bonded to each other. The thickness of the adhesive layer is preferably not smaller than the thickness of the metallic silver portion (or electrically-conductive metal portion) and may be preferably from 10 μm to 80 μm, more preferably from 20 μm to 50 μm.

The refractive index of the adhesive in the adhesive layer is preferably from 1.40 to 1.70. When the refractive index of the adhesive is from 1.40 to 1.70, the difference in refractive index between the support of the light-transmitting electromagnetic wave shield film and the adhesive can be reduced, making it possible to prevent the drop of visible light transmission.

The adhesive is preferably an adhesive that becomes fluidic when heated or under pressure, particularly preferably an adhesive that becomes fluidic when heated to 200° C. or less or pressed at a pressure of 1 Kgf/cm$^2$ or more.

When such an adhesive is used, the light-transmitting electromagnetic wave shield film can be bonded to the display or plastic sheet which is an adherend with the adhesive layer flowing. Thus, the light-transmitting electromagnetic wave shield film can be easily bonded even to an adherend having a curved surface or complicated shape by lamination or pressing, particularly pressing.

To this end, the softening temperature of the adhesive is preferably 200° C. or less. Since the working atmosphere normally has a temperature of less than 80° C. due to the purpose of the light-transmitting electromagnetic wave shield film, the softening temperature of the adhesive layer is preferably 80° C. or more, most preferably from 80° C. to 120° C. from the standpoint of workability. The term "softening temperature" as used herein is meant to indicate the temperature at which the viscosity of the adhesive is $10^{12}$ poise or less. In general, the adhesive is recognized to become fluidic in about 1 to 10 seconds at the softening temperature.

As the adhesive that becomes fluidic when heated or under pressure there may be used any of the following thermoplastic resins. Examples of thermoplastic resins employable herein include natural rubbers (refractive index n=1.52), dienes such as polyisoprene (n=1.521), poly-1,2-butadiene (n=1.50), polyisobutene (n=1.505 to 1.51), polybutene (n=1.513), poly-2-heptyl-1,3-butadiene (n=1.50), poly-2-t-butyl-1,3-butadiene (n=1.506) and poly-1,3-butadiene (n=1.515), polyethers such as polyoxyethylene (n=1.456), polyoxypropylene (n=1.450), polyvinyl ethyl ether (n=1.454), polyvinyl hexyl ether (n=1.459) and polyvinyl butyl ether (n=1.456), polyesters such as polyvinyl acetate (n=1.467) and polyvinyl propionate (n=1.467), and poly(meth) acrylic acid esters such as polyurethane (n=1.5 to 1.6), ethyl cellulose (n=1.479), polyvinyl chloride (n=1.54 to 1.55), polyacrylonitrile (n=1.52), polymethacrylonitrile (n=1.52), polysulfone (n=1.633), polysulfide (n=1.6), phenoxy resin (n=1.5 to 1.6), polyethylene acrylate (n=1.469), polybutyl acrylate (n=1.466), poly-2-ethylhexyl acrylate (n=1.463), poly-t-butyl acrylate (n=1.464), poly-3-ethoxy propyl acrylate (n=1.465), polyoxycarbonyl tetramethylene (n=1.465), polymethyl acrylate (n=1.472 to 1.480), polyisopropyl methacrylate (n=1.473), polydodecyl methacrylate (n=1.474), polytetradecyl methacrylate (n=1.475), poly-n-propyl methacrylate (n=1.484), poly-3,3,5-trimethylcyclohexyl methacrylate (n=1.484), polyethyl methacrylate (n=1.485), poly-2-nitro-2-methylpropyl methacrylate (n=1.487), poly-1,1-diethylpropyl methacrylate (n=1.489) and polymethyl methacrylate (n=1.489). Two or more of these acryl polymers may be used copolymerized or blended as necessary.

As the resin obtained by the copolymerization of acrylic resin with resin other than acryl there may be used also an epoxy acrylate (n=1.48 to 1.60), urethane acrylate (n=1.5 to 1.6), polyether acrylate (n=1.48 to 1.49) or polyester acrylate (n=1.48 to 1.54). From the standpoint of adhesion in particular, urethane acrylate, epoxy acrylate and polyether acrylate are excellent. Examples of the epoxy acrylate employable herein include (meth)acrylic acid adducts such as 1,6-hexanediol diglycidyl ether, neopentyl glycol diglycidyl ether, allyl alcohol diglycidyl ether, resorcinol diglycidyl ether, adipic acid diglycidyl ester, phthalic acid diglycidyl ester, polyethylene glycol diglycidyl ether, trimethylol propane triglycidyl ether, glycerin triglycidyl ether, pentaerythritol tetraglycidyl ether and sorbitol tetraglycidyl ether. A polymer having a hydroxyl group in its molecule such as epoxy acrylate is useful in the enhancement of adhesion. These copolymer resins may be used in combination of two more thereof as necessary.

On the other hand, as the adhesive polymer there is preferably used one having a weight-average molecular weight of 500 or more (hereinafter as measured on the calibration curve of standard polystyrene by gel permeation chromatography). When the molecular weight of the adhesive polymer is 500 or less, the resulting adhesive composition exhibits too low a cohesive force and thus can exhibit a deteriorated adhesion to the adherend.

The adhesive may comprise a hardener (crosslinking agent) incorporated therein. As the adhesive hardener there may be used any of amines such as triethylene tetramine, xylene diamine and diaminodiphenylmethane, acid anhydrides such as phthalic anhydride, maleic anhydride, dodecylsuccinic anhydride, pyromellitic anhydride and benzophenonetetracarboxylic anhydride, diaminodiphenylsulfone, tris (dimethylaminomethyl) phenol, polyamide resin, dicyandiamide and ethyl methyl imidazole. These hardeners may be used singly or in admixture of two or more thereof.

The added amount of the hardener is from 0.1 to 50 parts by mass, preferably from 1 to 30 parts by mass based on 100 parts by mass of the adhesive polymer. When the added amount of the hardener falls below 0.1 parts by mass, undercuring occurs. When the added amount of the hardener exceeds 50 parts by mass, overcrosslinking occurs, occasionally giving adverse effects on the adhesion.

The adhesive may comprise additives such as diluent, plasticizer, oxidation inhibitor, filler, colorant, ultraviolet absorber and tackifier incorporated therein besides the hardener as necessary.

The formation of the adhesive layer on the light-transmitting electromagnetic wave shield film can be accomplished by spreading an adhesive layer composition containing the aforementioned adhesive polymer, hardener and other additives over a partial or entire surface of the electrically-conductive metal portion, drying the coated material to remove the solvent, and then heating and curing the coated material.
<Protective Film>

The light-transmitting electromagnetic wave shield film according to the invention may have a protective film bonded thereto. The protective film may be provided on the both sides or on only one side (e.g., on the electrically-conductive metal portion) of the light-transmitting electromagnetic wave shield film.

The light-transmitting electromagnetic wave shield film often further has a functional film having an effect of reinforcing the outermost surface and providing antireflective properties and stainproofness bonded thereto as described later. Therefore, in the case where such a functional film is provided on the light-transmitting electromagnetic wave shield film, the protective film is preferably peeled. To this end, the protective film is preferably peelable.

The peel strength of the protective film is preferably from 5 mN/25 mm width to 5 N/25 mm width, more preferably from 10 mN/25 mm width to 100 mN/25 mm width. When the peel strength of the protective film falls below the lower limit, the protective film can be peeled too easily, making it more likely that the protective film can be peeled during handling or when touched carelessly. On the other hand, when the peel strength of the protective film exceeds the upper limit, a great force is needed to peel the protective film. Further, the mesh metal foil can be peeled off the transparent substrate film (or the adhesive layer) during peeling to disadvantage.

As the film constituting the protective film there is preferably used a film of polyolefin-based resin such as polyethylene resin and polypropylene resin, polyester resin such as polyethylene terephthalate resin, polycarbonate resin or acrylic resin. It is also preferred that the protective film be subjected to corona discharge treatment or laminated with an adhesive layer on the adherend surface thereof.
<Functional Film>

In the case where the light-transmitting electromagnetic wave shield film is used in display (particularly plasma display), the light-transmitting electromagnetic wave shield film preferably has a functional film having the following functionalities bonded thereto to have various functionalities. The functional film can be bonded to the light-transmitting electromagnetic wave shield film with an adhesive or the like interposed therebetween.
(Antireflection Properties/Antiglare Properties)

The light-transmitting electromagnetic wave shield film is preferably provided with any of functionalities such as anti-reflection (AR) properties for inhibiting reflection of external light, antiglare (AG) properties for preventing reflection of mirror image and anti-reflection/anti-glare (ARAG) properties having both of the two properties in combination.

These properties can prevent the display screen from being difficultly viewed due to the reflection of illuminating unit. Further, the reduction of the visible light reflectance of the surface of the film makes it possible to not only prevent reflection but also enhance contrast or the like. The visible light reflectance of the light-transmitting electromagnetic wave shield film having a functional film having anti-reflection properties/anti-glare properties bonded thereto is preferably 2% or less, more preferably 1.3% or less, even more preferably 0.8% or less.

The aforementioned functional film can be formed by providing a functional film having anti-reflection properties/anti-glare properties on a proper transparent substrate.

The anti-reflection layer can be formed by forming a single thin layer of a fluorine-based transparent polymer resin, magnesium fluoride, silicon-based resin or silicon oxide to an optical thickness of ¼ wavelength or forming a laminate of two or more thin layers of an inorganic compound such as metal oxide, fluoride, silicide, nitride or sulfide, silicon-based resin or organic compound such as acrylic resin and fluorine-based resin.

The anti-glare layer may be formed by a layer having a fine surface roughness of from about 0.1 μm to 10 μm. In some detail, the anti-glare layer can be formed by spreading an ink prepared by dispersing grains of an inorganic or organic compound such as silica, organic silicon compound, melamine and acryl in a thermosetting or photosetting resin such as acrylic resin, silicon-based resin, melamine-based resin, urethane-based resin, alkyd-based resin and fluorine-based resin over the substrate, and then curing the coat. The average grain diameter of the grains is preferably from about 1 μm to 40 μm.

The anti-glare layer can be formed also by curing the aforementioned coat of thermosetting or photosetting resin while pressing a mold having a desired gloss value or surface condition thereagainst.

The haze of the light-transmitting electromagnetic wave shield film having an anti-glare layer provided thereon is preferably from not smaller than 0.5% to not greater than 20%, more preferably from not smaller than 1% to not greater than 10%. When the haze of the light-transmitting electromagnetic wave shield film is too small, the resulting light-transmitting electromagnetic wave shield film exhibits insufficient anti-glare properties. When the haze of the light-transmitting electromagnetic wave shield film is too great, the resulting light-transmitting electromagnetic wave shield film tends to have a lowered sharpness of transmitted image.
(Hard Coat Properties)

In order to render the light-transmitting electromagnetic wave shield film scratch-proof, it is also preferred that the functional film have hard coat properties. The hard coat layer may be formed by a thermosetting or photosetting resin such as acrylic resin, silicon-based resin, melamine-based resin, urethane-based resin, alkyd-based resin and fluorine-based resin. However, neither the kind of the material of the hard coat layer nor the method for forming the hard coat layer is specifically limited. The thickness of the hard coat layer is preferably from about 1 μm to 50 μm. When the aforementioned anti-reflection layer and/or anti-glare layer is formed on the hard coat layer, a functional film having scratch-proofness, anti-reflection properties and/or anti-glare properties can be obtained to advantage.

The surface hardness of the light-transmitting electromagnetic wave shield film thus provided with hard coat properties is preferably at least H, more preferably 2H, even more preferably 3 H or more as calculated in terms of pencil hardness according to JIS (K-5400).
(Antistatic Properties)

In order to prevent the attachment of dust due to triboelectric charge or electrostatic discharge to human body, the light-transmitting electromagnetic wave shield film is preferably provided with antistatic properties.

As a functional film having antistatic properties there may be used a film having a high electrical conductivity. For example, a film having an electrical conductivity of about $10^{11} \Omega/\square$ or less as calculated in terms of surface resistivity may be used.

Such a film having a high electrical conductivity can be formed by providing an antistatic layer on the transparent substrate. Specific examples of the antistatic agent to be incorporated in the antistatic layer include PELESTAT (produced by Sanyo Chemical Industries, Ltd.), and ELECTROSLIPPER (produced by Kao Corporation). Alternatively, the antistatic layer may be formed by any known transparent electrically-conductive film or an electrically-conductive film having an electrically-conductive particulate material such as particulate ITO and particulate tin oxide dispersed therein. Further, the aforementioned hard coat layer, anti-reflection layer or anti-glare layer may comprise an electrically-conductive particulate material incorporated therein to exhibit antistatic properties.

(Stainproofness)

A light-transmitting electromagnetic wave shield film which is stainproof can be protected against stain such as finger print or can be easily freed of any attached stain to advantage.

The stainproof functional film can be obtained, e.g., by providing the transparent substrate with a stainproof compound. As the stainproof compound there may be used any compound which is nonwettable with water and/or oil and fat. Examples of such a compound include fluorine compounds and silicon compounds. Specific examples of the fluorine compound include Optool (produced by DAIKIN INDUSTRIES, ltd.). Specific examples of the silicon compound include Takataquontum (produced by NOF Corporation).

(Ultraviolet Ray Blocking Properties)

The light-transmitting electromagnetic wave shield film is preferably provided with ultraviolet ray blocking properties for the purpose of preventing the deterioration of dyes described later or transparent substrate. The functional film having ultraviolet ray blocking properties can be formed by incorporating an ultraviolet absorber in the transparent substrate itself or by providing an ultraviolet-absorbing layer on the transparent substrate.

Referring to the ultraviolet blocking capability required to protect the dyes, the transmission of light in the ultraviolet range of shorter than 380 nm is 20% or less, preferably 10% or less, more preferably 5% or less. The functional film having ultraviolet ray blocking properties can be obtained by forming a layer containing an ultraviolet absorber or an ultraviolet ray reflecting or absorbing inorganic compound on the transparent substrate. As the ultraviolet absorber there may be used any known ultraviolet absorber such as benzotriazole-based compound and benzophenone-based compound. The kind and concentration of the ultraviolet absorber to be used herein depend on the dispersibility or solubility in the medium in which it is dispersed or dissolved, the desired absorption wavelength and absorption coefficient and the thickness of the medium and thus are not specifically limited.

The functional film having ultraviolet blocking properties preferably has little absorption in the visible light range and exhibits no remarkable drop of visible light transmission or assumes no yellow color.

In the case where the functional film has a layer containing dyes described later formed therein, it is preferred that the layer having ultraviolet ray blocking properties be present outside the dye-containing layer.

(Gas Barrier Properties)

When the light-transmitting electromagnetic wave shield film is used in an atmosphere having a high temperature and humidity than ordinary temperature and humidity, the dyes described later can be deteriorated by water content, water content condenses in the adhesive used for bonding or on the adherend interface to cause fogging or the effect of water content causes the phase separation of the adhesive, resulting in precipitation or fogging. Therefore, the light-transmitting electromagnetic wave shield film preferably has gas barrier properties.

In order to prevent the deterioration of dyes or fogging, it is essential to prevent the penetration of water content into the dye-containing layer or the adhesive layer. To this end, the water vapor permeability of the functional film is 10 g/m²·day or less, preferably 5 g/m²·day or less.

(Other Optical Properties)

A plasma display emits strong near infrared rays. Therefore, the light-transmitting electromagnetic wave shield film, particularly if used in plasma display, is preferably provided with infrared ray blocking properties (particularly near infrared ray blocking properties).

As a functional film having near infrared blocking properties there is preferably a functional film having a transmission of 25% or less, more preferably 15% or less, even more preferably 10% or less in the wavelength range of from 800 nm to 1,000 nm.

The light-transmitting electromagnetic wave shield film, if used in plasma display, preferably transmits neutral gray color or blue gray color rays. This is intended to maintain or enhance the light-emitting properties and contrast of plasma display. This is also because white color having a somewhat higher color temperature than standard white color may be occasionally desired.

Further, a color plasma display is said to have an insufficient color reproducibility. A color plasma display is particularly disadvantageous in that the emission spectrum of red display has several emission peaks in the wavelength range of from 580 nm to 700 nm, causing the emission of red color which is close to orange color due to the effect of a relatively strong emission peak on the shorter wavelength side and resulting in the display of a poor purity color. Therefore, the functional film preferably acts to selectively eliminate unnecessary light from the fluorescent material or discharging gas that causes the aforementioned problems.

These optical properties can be controlled by the use of dyes. In other words, in order to block near infrared rays, a near infrared absorber may be used. In order to eliminate unnecessary light emission, a dye which selectively absorbs unnecessary light emission may be used to provide desired optical properties. Further, desired color tone of optical filer can be provided by the use of a dye having a proper absorption in the visible light range.

As such a dye there may be used an ordinary dye or pigment having a desired absorption wavelength in the visible light range or a compound known as near infrared absorber. The kind of these dyes, pigments or compounds is not specifically limited. However, examples of these dyes, pigments or compounds include organic dyes which are also commercially available, such as anthraquinone-based compound, phthalocyanine-based compound, methine-based compound, azomethine-based compound, oxazine-based compound, imonium-based compound, azo-based compound, styryl-based compound, coumarine-based compound, porphyrin-based compound, dibenzofuranone-based compound, diketopyrolopyrol-based compound, rhodamine-based compound, xanthene-based compound, pyromethene-based compound, dithiol-based compound and diiminium-based compound.

A plasma display generates a high temperature on the surface of the panel. When the working atmosphere has a high temperature, the light-transmitting electromagnetic wave shield film used, too, has a high temperature. Therefore, the dye to be used is preferably so heat-resistant that it cannot be deteriorated at a temperature as high as about 80° C.

Some dyes are poor in light-resistance. In the case where the use of such a dye causes a problem of dye deterioration by light rays emitted by the plasma display or the external ultraviolet rays or visible light, the functional film may comprise an ultraviolet absorber incorporated therein as previously mentioned or a layer which transmits no ultraviolet rays may be provided to prevent the deterioration of dyes by ultraviolet rays or visible light.

This can apply also to humidity or complex of heat, light and humidity besides heat and light. When these dyes are deteriorated, the transmission of the optical filter can change, occasionally causing the change of color tone or the deterioration of near infrared blocking properties.

These dyes also preferably have a high solubility or dispersibility in the solvent so that they can be dissolved or dispersed in the resin composition for forming the transparent substrate or the coating composition for forming the coat layer.

The concentration of these dyes can be properly predetermined depending on the absorption wavelength and absorption coefficient of the dyes, the transmission properties and transmittance required for the light-transmitting electromagnetic wave shield film and the kind and thickness of the medium or coat layer in which they are dispersed.

In the case where these dyes are incorporated in the functional film, they may be incorporated in the interior of the transparent substrate or the surface of the substrate may be coated with a layer containing these dyes. Alternatively, the adhesive layer may comprise these dyes incorporated therein. Alternatively, two or more dyes having different absorption wavelength ranges may be incorporated in one layer in admixture. Alternatively, two or more layers containing dyes may be provided.

Further, some dyes are subject to deterioration when they come in contact with metal. Therefore, in the case where these dyes are used, the functional film containing these dyes is more preferably disposed in such an arrangement that the layers containing dyes don't come in contact with the electrically-conductive metal portion on the light-transmitting electromagnetic wave shield film.

EXAMPLE

Example 1

(Preparation of Emulsion A)

| Solution 1: | |
|---|---|
| Water | 750 ml |
| Gelatin | 20 g |
| Sodium chloride | 1.6 g |
| 1,3-Dimethylimidazolidine-2-thione | 20 mg |
| Sodium benzenethiosulfonate | 10 mg |
| Citric acid | 0.7 g |
| Solution 2: | |
| Water | 300 ml |
| Silver nitrate | 150 g |

| Solution 3: | |
|---|---|
| Water | 300 ml |
| Sodium chloride | 38 g |
| Potassium bromide | 32 g |
| Potassium hexachloroiridiumate (III) (0.005% KCl 20% aqueous solution) | 5 ml |
| Ammonium hexachlorodiumate (0.001% NaCl 20% aqueous solution) | 7 ml |

Potassium hexachloroiridiumate (III) (0.005% KCl 20% aqueous solution) and ammonium hexachlorodiumate (0.001% NaCl 20% aqueous solution) used in Solution 3 were prepared by dissolving the powdered materials in 20% aqueous solution of KCl and 20% aqueous solution of NaCl, respectively, and then heating the solutions to 40° C. for 120 minutes.

To Solution 1 which had been kept at 38° C. and pH 4.5 were then added simultaneously 90% of Solution 2 and Solution 3 with stirring in 20 minutes to form nucleus grains having a diameter of 0.15 μm. Subsequently, to the mixture were added the following Solution 4 and Solution 5 in 8 minutes. To the mixture were then added 10% of the remaining portion of Solution 2 and Solution 3 in 2 minutes to cause the grains to grow to 0.18 μm. To the mixture was then added 0.15 g of potassium iodide. The mixture was then ripened for 5 minutes to terminate the formation of grains.

| Solution 4: | |
|---|---|
| Water | 100 ml |
| Silver nitrate | 50 g |
| Solution 5: | |
| Water | 100 ml |
| Sodium chloride | 13 g |
| Potassium bromide | 11 g |
| Yellow prussiate | 5 mg |

Thereafter, the mixture was rinsed by an ordinary flocculation method. In some detail, the temperature of the mixture was lowered to 35° C. To the mixture was then added 3 g of the following anionic precipitant-1. The pH value of the mixture was then lowered with sulfuric acid until silver halides were precipitated. (The pH range was 3.2±0.2.) Subsequently, the resulting supernatant liquid was removed in an amount of about 3 l (first rinse). To the mixture was then added 3 l of distilled water. To the mixture was then added sulfuric acid until silver halides were precipitated. The resulting supernatant liquid was again removed in an amount of 3 l (second rinse). The second rinse was then repeated once (third rinse) to terminate the rinse/desalting step. To the emulsion thus rinsed and desalted was then added 8 g of gelatin so that the pH value and pAg value thereof reached 5.6 and 7.5, respectively. To the emulsion were then added 10 mg of sodium benzenethiosulfonate, 3 mg of sodium benzenethiosulfinate, 15 mg of sodium thiosulfate and 10 mg of chloroauric acid. The emulsion was then subjected to chemical sensitization at 55° C. to obtain an optimum sensitivity. To the emulsion were then added 100 mg of 1,3,3a,7-tetraazaindene as a stabilizer and 100 mg of Proxel (trade name; produced by ICI Co., Ltd.) as a preservative. Eventually, an emulsion of cubic grains of silver bromochloroiodide comprising 70 mol-% of silver chloride and 0.08 mol-% of silver iodide and having an average grain diameter of 0.18 μm and a fluctuation coefficient of 9% was obtained. (Eventually, the emulsion thus obtained exhibited a pH value of 5.7, a pAg value of 7.5, an electrical conductivity of 60 μS/m, a density of 1.28×10³ kg/m³ and a viscosity of 60 mPa·s.)

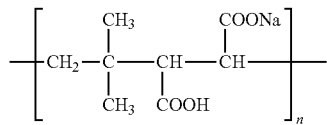

Anionic precipitant-1

Average molecular weight: 120,000

(Preparation of Photosensitive Material 1)

A UL layer coating solution and an emulsion layer coating solution were then spread over a polyethylene terephthalate film support having a moisture-proofing undercoat layer comprising vinylidene chloride provided on both sides thereof to form a laminate of UL layer/emulsion layer. The method for preparing the various layer coating solutions, the spread of the various coating solutions and the spreading method will be described hereinafter.

<Emulsion Layer>

Emulsion A was subjected to spectral sensitization with a sensitizing dye (sd-1) in an amount of $5.7 \times 10^{-4}$ mols/mol Ag. To the emulsion were then added KBr in an amount of $3.4 \times 10^{-4}$ mols/mol Ag and Compound (Cpd-3) in an amount of $8.0 \times 10^{-4}$ mols/mol Ag. The mixture was then thoroughly stirred.

Subsequently, to the emulsion were added 1,3,3a,7-tetraazaindene, hydroquinone and citric acid in an amount of $1.2 \times 10^{-4}$ mols/mol Ag, $1.2 \times 10^{-2}$ mols/mol Ag and $3.0 \times 10^{-4}$ mols/mol Ag, respectively. To the emulsion were also added surface active agents (Sa-1), (Sa-2) and (Sa-3) in such an amount that the spread thereof reached 60 mg/m², 40 mg/m² and 2 mg/m², respectively. The pH value of the coating solution was then adjusted with citric acid to 5.6. The emulsion layer coating solution thus prepared was then spread over the following support in such an amount that the spread of Ag and gelatin reached 7.6 g/m² and 1.1 g/m², respectively.

| <UL layer> | |
|---|---|
| Gelatin | 0.23 g/m² |
| Compound (Cpd-7) | 40 mg/m² |
| Compound (Cpd-14) | 10 mg/m² |
| Preservative (Proxel) | 1.5 mg/m² |

The various layer coating solutions were each adjusted with a thickening agent represented by the following structural formula (Z) to a desired viscosity.

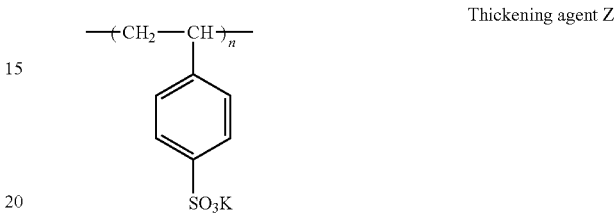

Thickening agent Z

The sample used in the present example had a back layer and an electrically-conductive layer having the following formulations formed thereon.

| <Back layer> | |
|---|---|
| Gelatin | 3.3 g/m² |
| Compound (Cpd-15) | 40 mg/m² |
| Compound (Cpd-16) | 20 mg/m² |
| Compound (Cpd-17) | 90 mg/m² |
| Compound (Cpd-18) | 40 mg/m² |
| Compound (Cpd-19) | 26 mg/m² |
| 1,3-Divnylsulfonyl-2-propanol | 60 mg/m² |
| Particulate polymethyl methacrylate (average particle diameter: 6.5 μm) | 30 mg/m² |
| Liquid paraffin | 78 mg/m² |
| Compound (Cpd-7) | 120 mg/m² |
| Calcium nitrate | 20 mg/m² |
| Preservative (Proxel) | 12 mg/m² |
| <Electrically-conductive layer> | |
| Gelatin | 0.1 g/m² |
| Sodium dodecylbenzenesulfonate | 20 mg/m² |
| SnO₂/Sb (9/1 (by weight); average particle diameter: 0.25 μm) | 200 mg/m² |
| Preservative (Proxel) | 0.3 mg/m² |

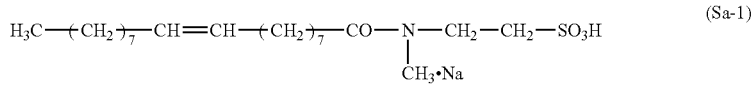

(Sa-1)

60 mg/m²

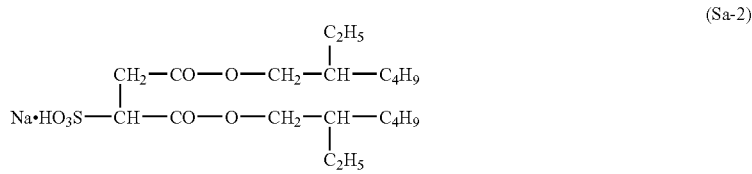

(Sa-2)

40 mg/m²

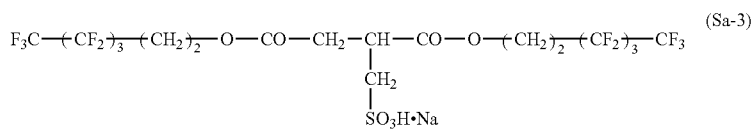
(Sa-3)
2 mg/m²
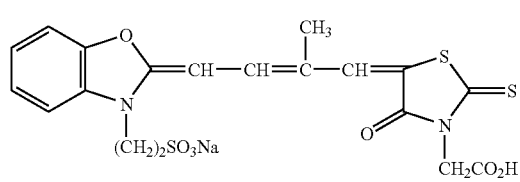
SD-1
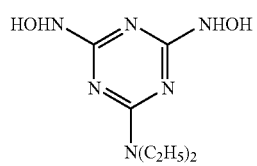
Cpd-3
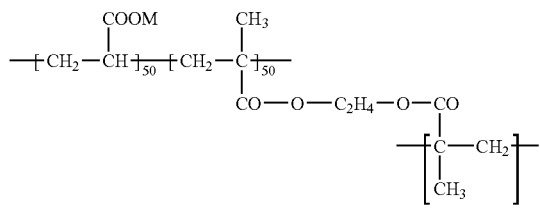
aqL-6
M = H or Na
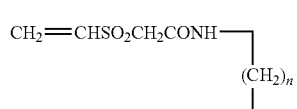
Cpd-7
(n = 3):(n = 3) = 3:1
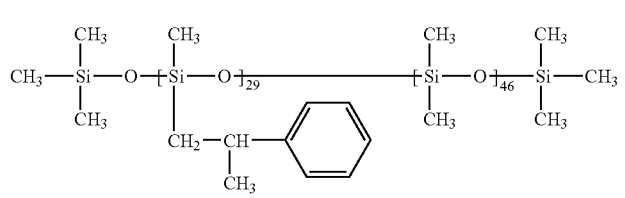
Cpd-8
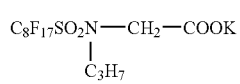
Cpd-9
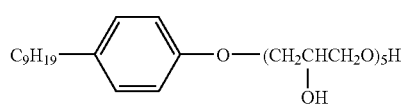
Cpd-10
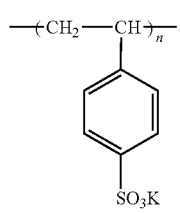
Cpd-11
Average molecular weight: 1,000,000

-continued
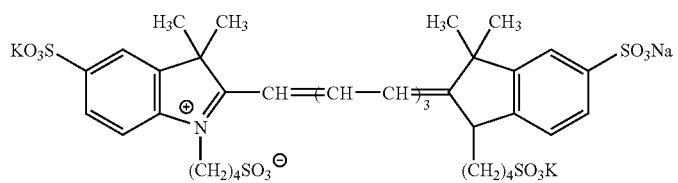
Cpd-13
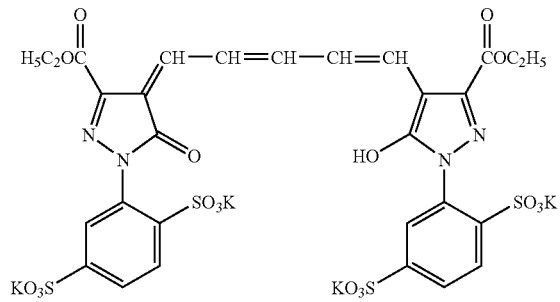
Cpd-14
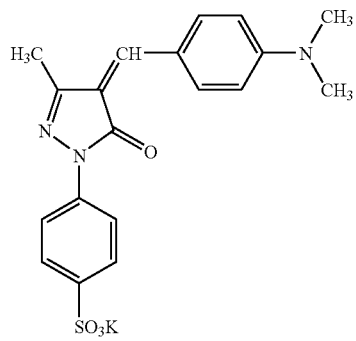
Cpd-15
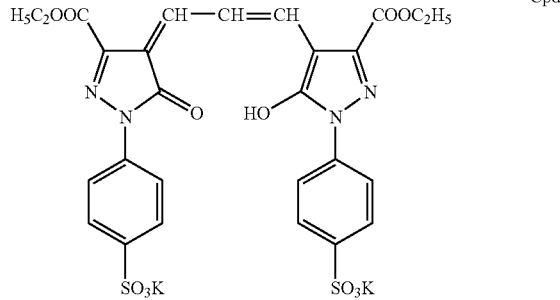
Cpd-16
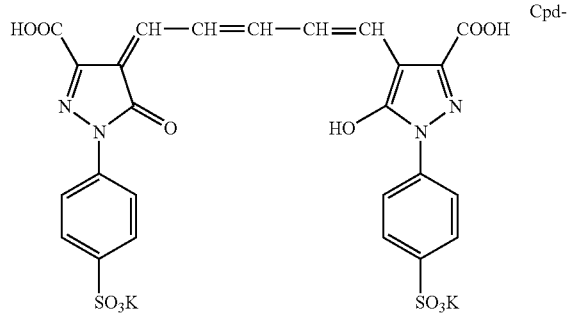
Cpd-17
CH₃(CH₂)₁₁CH=CHSO₃Na    Cpd-18
CH₃(CH₂)₁₁CH₂—CHSO₃Na    Cpd-19

<Support>

Undercoat layer coating solutions 1 and 2 were spread over the respective side of a biaxially-stretched polyethylene terephthalate support (thickness: 100 µm).

| <Undercoat layer 1> | |
| --- | --- |
| Core-shell type vinylidene chloride copolymer (1) | 15 g |
| 2,4-Dichloro-6-hydroxy-s-triazine | 0.25 g |
| Particulate polystyrene (average particle diameter: 3 µm) | 0.05 g |
| Compound (Cpd-20) | 0.20 g |
| Colloidal silica (Snowtex ZL: particle diameter: 70-100 µm; produced by NISSAN CHEMICAL INDUSTRIES, LTD.) | 0.12 g |
| Water to make | 100 g |

The mixture was then adjusted with a 10 wt-% KOH to pH 6. The coating solution thus obtained was then spread over the support in an amount such that the film dried at 180° C. for 2 minutes had a thickness of 0.9 µm.

| <Undercoat layer 2> | |
| --- | --- |
| Gelatin | 1 g |
| Methyl cellulose acylate | 0.05 g |
| Compound (Cpd-21) | 0.02 g |
| $C_{12}H_{25}O(CH_2CH_2O)_{10}H$ | 0.03 g |
| Proxel | $3.5 \times 10^{-3}$ g |
| Acetic acid | 0.2 g |
| Water to make | 100 g |

The coating solution thus obtained was then spread over the support in an amount such that the film dried at 170° C. for 2 minutes had a thickness of 0.1 µm.

Core-shell type vinylidene chloride copolymer (1)

$$-(CH_2C)_{90}-(CH_2C)_4-(CH_2C)_4-(CH_2C)_1-(CH_2C)_1-$$

VDC   MMa   MA   AN   AA

Core: VDC/MMA/MA (80 wt-%)
Shell: VDC/AN/AA (20 wt-%)
Average particle size: 70 nm Compound (Cpd-20)

Compound (Cpd-21)
HO[CO(CH₂)₄CONH(CH₂)₂N(CH₂)₂NH] H·HCl
          |
         CH₂
          |
         CHOH
          |
         CH₂Cl <Spreading Method>

The UL layer coating solution and the emulsion layer coating solution were simultaneously spread over the aforementioned undercoated support on the emulsion layer side thereof while the temperature was being kept at 35° C. by a slide bead coating method in such an arrangement that the UL layer was closer to the support than the emulsion layer. The coated support was then passed through a cold air setting zone (5° C.). During this procedure, Cpd-7, which is a hardener, was added to the UL layer coating solution shortly before spreading in the above defined amount so that it was diffused from the UL layer into the emulsion layer. The electrically-conductive layer coating solution and the back layer coating solution were simultaneously spread over the support on the side thereof opposite the emulsion layer while being provided with a hardener by a curtain coating method in such an arrangement that the electrically-conductive layer was closer to the support than the back layer. The coated support was then passed through a cold air setting zone (5° C.). When the coated support had been passed through the various setting zones, the various coating solutions each showed sufficient setting properties. Subsequently, the coated support was treated in a drying zone so that it was dried simultaneously on the both sides thereof.

A PET support having a thickness of 90 µm and a width of 78 cm was used. Spreading was effected on the 78-cm width PET support at a width of 76 cm over a length of 200 m. The coated PET support was then trimmed by 9 cm at the respective edge thereof so that the central 58 cm coated portion thereof was left to obtain a silver halide photosensitive material (photosensitive material 1) in rolled form.

The photosensitive material 1 thus obtained had a silver spread of 7.6 g/m² and comprised an emulsion layer having an Ag/gelatin weight ratio of 6.9 provided therein as an outermost layer.

The photosensitive material 1 thus obtained was then subjected to the following exposure, development and plating.
(Exposure)

The photosensitive material 1 thus dried was then exposed to light through a lattice pattern capable of giving a developed silver image having a line/space ratio of 15 µm/285 µm (pitch: 300 µm) to the emulsion layer using a Type FT-R5055 image setter produced by DAINIPPON SCREEN MFG. CO., LTD. During this procedure, an adjustment was made such that an optimum exposure was obtained.
(Development)

| Formulation of developer 1 L | |
| --- | --- |
| Hydroquinone | 30 g |
| Sodium sulfite | 20 g |
| Potassium carbonate | 40 g |
| Ethylenediamine tetraacetate | 2 g |
| Potassium bromide | 3 g |
| Polyethylene glycol 1000 | 1 g |
| 5-Methylbenzotriazole | 0.08 g |
| Compound (1) | 0.06 g |
| Compound (2) | 0.02 g |
| Potassium hydroxide | 6 g |
| pH adjusted to | 10.6 |
| Formulation of fixing solution 1 L | |
| Ammonium thiosulfate (75%) | 300 ml |
| Ammonium sulfite monohydrate | 25 g |
| Ethylenediamine tetraacetate | 2 g |
| Potassium iodide | 1.5 g |
| Acetic acid | 5 g |

-continued

| | |
|---|---|
| Aqueous ammonia (27%) | 1 g |
| pH adjusted to | 6.2 |

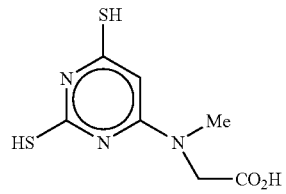

Compound (1)

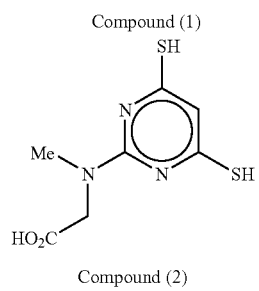

Compound (2)

The sample thus exposed was subjected to processing with the aforementioned processing solutions (development: 33° C., 20 seconds; fixing: 33° C., 15 seconds; rinse: flowing water from well, 5 l/min, 20 seconds) using a Type FG-710PTS automatic developing machine (produced by Fuji Photo Film Co., Ltd.).

Referring to running conditions, the photosensitive material was processed at a rate of 100 m$^2$/day, the developer was replenished at a rate of 800 ml/m$^2$, and the fixing was effected at a rate of 1,000 ml/m$^2$ for 3 days. Both the start tank solution and the replenisher were the same as the aforementioned processing solutions.

The film thus eventually obtained after the aforementioned processing had a surface resistivity of 16.5Ω/□.

(Plating/Blackening)

Subsequently, the film thus developed was subjected to the following electrocopper plating and blackening for the following period of time using the electroplating apparatus shown in FIG. 1 to prepare a light-transmitting electrically-conductive film (Sample 1). The electroplating step and the blackening step were as follows.

| Step | Processing time | Electrolytic voltage (V) | Electrolytic current (A) |
|---|---|---|---|
| Plating tank 21a | 1 min | 12.0 | 1.8 |
| Plating tank 21b | 1 min | 11.5 | 1.8 |
| Plating tank 21c | 1 min | 9.1 | 2.0 |
| Plating tank 21d | 1 min | 8.9 | 2.2 |
| Plating tank 21e | 3 min | 7.2 | 2.8 |
| Plating tank 21f | 3 min | 5.0 | 3.4 |
| Plating tank 21g | 3 min | 3.1 | 4.5 |
| First rinse tank 31 | 3 min | | |
| Blackening tank 32 | 3 min | (Current-controlled) | 2.0 |
| Second rinse tank 33 | 3 min | | |

The average plating time (average dipping time) and the average plating voltage of the plating tanks 21a to 21c at the former half stage 22 were 1 minute and 10.9 V, respectively. The average plating time (average dipping time) and the average plating voltage of the plating tanks 21e to 21g at the latter half stage 23 were 3 minutes and 5.1 V, respectively.

Accordingly, the average plating time at the former half stage 22 was 33.3% of that at the latter half stage 23 and the average plating voltage at the latter half stage 23 was 46.8% at the former half stage 22.

The distance between the lowermost position at which the electricity feed roller 26 and the silver mesh surface of the film come in contact with each other and the level of the plating solution was 5 cm. The line conveying speed was 1 m/min. Well water was allowed to flow over the entire body of all the electricity feed rollers 26 at a rate of 500 ml/min so that the plating solution attached to the electricity feed rollers 26 was removed away. The wash water was then recovered so that it didn't flow into the plating tanks 21a to 21g.

The formulation and temperature of the plating solution at the plating step and blackening step will be described below.

| Formulation of electrocopper plating solution: | |
|---|---|
| Cupric sulfate pentahydrate | 190 g |
| Sulfuric acid | 20 g |
| Hydrochloric acid (35%) | 0.06 ml |
| Copper Gleam PCM (produced by Rohm & Haas Company) | 15 ml |
| Purified water to make | 1 l |
| Temperature of processing with electrocopper plating solution: | 20° C. |
| Formulation of blackening solution: | |
| Nickel sulfate | 70 g/l |
| Nickel ammonium sulfate | 35 g/l |
| Zinc sulfate | 25 g/l |
| Sodium thiocyanate | 20 g/l |
| (As both the start solution and replenisher for the blackening solution there were each used the aforementioned formulation. The replenishing rate was 500 ml/m.) | |
| pH value of blackening solution: | 4.8 |
| Temperature of processing with blackening solution: | 50° C. |

As the rinse water there was used well water having a temperature of 20° C. in all the steps. Well water flew at a rate of 10 l/min.

(Preparation of Samples 2 to 6)

Light-transmitting electrically-conductive films (Samples 2 to 6) were prepared from the photosensitive material 1 thus prepared in the same manner as in Example 1 up to the exposure and development steps except that the electroplating time, voltage and current were changed as set forth in Table 1.

(Evaluation)

Samples 1 to 6 thus prepared were then each measured for surface resistivity. For the measurement of surface resistivity, a Type Loresta GP (Model No. MCP-T610) series 4-pin probe (ASP) (produced by DIA INSTRUMENTS Co. Ltd). The measurement was made on 50 arbitrary points on the sample except the forward 50 cm end portion and rear 50 cm end portion thereof. The measurements were then averaged.

The samples were each visually evaluated for uneven plating. The evaluation of uneven plating was made according to the following four-step criterion.

1: Little or no uneven observed;
2: Area observed uneven in plating accounts for less than 20% of the total area;
3: Area observed uneven in plating accounts for from not smaller than 20% to less than 80% of the total area; and
4: Area observed uneven in plating accounts for 80% or more of the total area The results of evaluation of Samples 1 to 6 are set forth in Table 1 below.

TABLE 1

| Plating tank | Sample 1 (Inventive) | | | Sample 2 (Inventive) | | | Sample 3 (Inventive) | | |
|---|---|---|---|---|---|---|---|---|---|
| | Time (min) | Voltage (V) | Current (A) | Time (min) | Voltage (V) | Current (A) | Time (min) | Voltage (V) | Current (A) |
| 21a | 1 | 12 | 1.8 | 3 | 12 | 1.8 | 1 | 12 | 1.8 |
| 21b | 1 | 11.5 | 1.8 | 3 | 11.5 | 1.6 | 1 | 11.5 | 1.8 |
| 21c | 1 | 9.1 | 2.0 | 3 | 9.1 | 1.5 | 1 | 9.1 | 2.0 |
| 21d | 1 | 8.9 | 2.2 | 3 | 8.9 | 1.5 | 1 | 8.9 | 2.2 |
| 21e | 3 | 7.2 | 2.8 | 3 | 7.2 | 2.1 | 3 | 8.5 | 2.2 |
| 21f | 3 | 5.0 | 3.4 | 3 | 5.0 | 2.5 | 3 | 7.0 | 2.4 |
| 21g | 3 | 3.1 | 4.5 | 3 | 3.1 | 3.5 | 3 | 6.4 | 2.5 |
| Former half stage | 1 | 10.9 | — | 3 | 10.9 | — | 1 | 10.9 | — |
| Latter half stage | 3 | 5.1 | — | 3 | 5.1 | — | 3 | 7.3 | — |
| Ratio | 33.3% | 46.8% | — | 100% | 46.8% | — | 33.3% | 67.0% | — |
| Surface resistivity | | 0.31 Ω/D | | | 0.43 Ω/D | | | 0.71 Ω/D | |
| Unevenness | | 2 | | | 2 | | | 3 | |

| Plating tank | Sample 4 (Inventive) | | | Sample 5 (Inventive) | | | Sample 6 (Comparative) | | |
|---|---|---|---|---|---|---|---|---|---|
| | Time (min) | Voltage (V) | Current (A) | Time (min) | Voltage (V) | Current (A) | Time (min) | Voltage (V) | Current (A) |
| 1 | 1 | 12 | 1.8 | 1 | 12 | 1.8 | 3 | 12 | 1.8 |
| 2 | 1.2 | 11.5 | 1.8 | 1 | 12 | 2.0 | 3 | 11.5 | 1.6 |
| 3 | 1.7 | 9.1 | 1.8 | 1 | 12 | 2.3 | 3 | 9.1 | 1.5 |
| 4 | 1.7 | 8.9 | 1.9 | 1 | 10 | 2.6 | 3 | 8.9 | 1.5 |
| 5 | 3 | 7.2 | 2.5 | 3 | 5.2 | 3.3 | 3 | 8.5 | 1.8 |
| 6 | 3 | 5.0 | 3.0 | 3 | 3.2 | 3.8 | 3 | 7.0 | 1.2 |
| 7 | 3 | 3.1 | 4.0 | 3 | 2.1 | 5.1 | 3 | 6.4 | 1.2 |
| Former half stage | 1 | 10.9 | — | 1 | 12 | — | 3 | 10.9 | — |
| Latter half stage | 3 | 5.1 | — | 3 | 3.5 | — | 3 | 7.3 | — |
| Ratio | 43.3% | 46.8% | — | 33.3% | 29.2% | — | 100% | 67.0% | — |
| Surface resistivity | | 0.39 Ω/D | | | 0.22 Ω/D | | | 2.3 Ω/D | |
| Unevenness | | 2 | | | 1 | | | 4 | |

*The term "ratio" as used in Table 1 above is meant to indicate the ratio of the processing time at the former half stage to at the latter half stage or the ratio of the applied voltage at the latter half stage to at the former half stage.

Example 2

Samples were prepared in the same manner as Samples 1 and 5 of Example 1 except that as the support for photosensitive material there was used a biaxially-stretched polyethylene terephthalate (hereinafter referred to as "PET") film (thickness: 50 μm).

A protective film having a total thickness of 28 μm (Model No. HT-25, produced by PANAC INDUSTRIES, INC.) was then stuck to the PET support on the side thereof opposite the metal mesh using a laminator roller. A protective film having a total thickness of 65 μm comprising an acrylic adhesive layer laminated on a polyethylene film (Trade name: Sunitect Y-26F, produced by SUN A KAKEN CO., Ltd.) was stuck to the PET support on the metal mesh side thereof using a laminator roller.

Subsequently, the PET support was stuck to a glass sheet having a thickness of 2.5 mm and an external size of 950 mm×550 mm with a transparent acrylic adhesive interposed therebetween in such an arrangement that the side thereof opposite the metal mesh was disposed thereinside.

Subsequently, an antireflection near infrared absorbing film composed of a 100 μm thick PET film, an antireflection layer and a near infrared absorber-containing layer (trade name: CLEARAS AR/NIR, SUMITOMO OSAKA CEMENT CO., LTD.) was stuck to the metal mesh except the 20 mm edge area with an acrylic light-transmitting adhesive material having a thickness of 25 μm. The acrylic light-transmitting adhesive material had contained color-toning dyes for adjusting the light transmission of optical filter (PS-Red-G, PS-Violet-RC, produced by Mitsui Chemical Corporation).

An antireflection film (trade name: ReaLook 8201, produced by NOF CORPORATION) was then stuck to the glass sheet with an adhesive material interposed therebetween to prepare an optical filter.

The optical filter thus obtained had been produced from an electromagnetic wave shield having a protective film and thus showed extremely little scratch and metal mesh defect. Further, since the metal mesh was black, the resulting display image didn't assume metallic color. Moreover, the optical filter exhibited practically acceptable electromagnetic wave shielding capacity and near infrared cutting capacity (transmission at a wavelength of 300 nm to 800 nm: 15% or less). The optical filter exhibited an excellent viewability attributed to the antireflection layer provided on the both sides thereof. The incorporation of dyes made it possible to render the optical filter capable of toning color. It was thus made obvious that the optical filter can be used as an optical filter for plasma display, etc. to advantage.

INDUSTRIAL APPLICABILITY

In accordance with the plating method according to the invention, the average plating time at the former half stage is shorter than that at the latter half stage or the average plating voltage at the latter half stage is 60% or less of that at the former half stage, making it possible to effect uniform plating and hence obtain a film having a low surface resistivity.

In accordance with the invention, a uniformly plated light-transmitting electrically-conductive film and light-transmitting electromagnetic wave shield film can be obtained.

The entire disclosure of each and every foreign patent application from which the benefit of foreign priority has been claimed in the present application is incorporated herein by reference, as if fully set forth.

The invention claimed is:

1. A plating method comprising:
continuously electroplating a surface of a film having a surface resistivity of from 1 to 1,000Ω/□ in a plurality of times in plural plating tanks,
wherein the plurality of times are equally divided into a former half stage and a latter half stage,
wherein an average plating voltage at the latter half stage of the electroplating step is 60% or less of an average plating voltage at the former half stage of the electroplating,
wherein an applied voltage is from 1V to 100V,
wherein a current at inlet side of a first plating tank included in the plural plating tanks is from 1 A to 30 A, and
wherein a conveying speed of the film is from 1 m/min to 30 m/min.

2. The plating method according to claim 1, wherein the electroplating step is effected in a constant voltage control mode.

3. The plating method according to claim 1, wherein the film is a film patterned with a silver mesh.

4. The plating method according to claim 3, wherein the silver mesh is formed from a developed silver.

5. The plating method according to claim 1, wherein the applied voltage is from 2V to 60V, and wherein the current at inlet side of the first plating tank is from 1 A to 10 A.

6. The plating method according to claim 1, wherein the conveying speed of the film is predetermined to be from 1 m/min to 10 m/min.

7. The plating method according to claim 1, wherein the average plating voltage at the latter half stage of the electroplating is 50% or less of the average plating at the former half stage of the electroplating.

8. A plating method comprising:
continuously electroplating a surface of a film having a surface resistivity of from 1 to 1,000Ω/□ in a plurality of times in plural plating tanks,
wherein the plurality of times are equally divided into a former half stage and a latter half stage,
wherein an average plating voltage at the latter half stage of the electroplating is 60% or less of an average plating voltage at the former half stage of the electroplating,
wherein an average plating time of the former half stage of the electroplating is 70% or less of an average plating time of the latter half stage of the electroplating,
wherein an applied voltage is from 1V to 100V,
wherein a current at inlet side of a first plating tank included in the plural plating tanks is from 1 A to 30 A, and
wherein a conveying speed of the film is from 1 m/min to 30 m/min.

* * * * *